(12) United States Patent
Wada et al.

(10) Patent No.: US 8,022,461 B2
(45) Date of Patent: Sep. 20, 2011

(54) SEMICONDUCTOR DEVICE AND METHOD FOR FABRICATING SEMICONDUCTOR DEVICE

(75) Inventors: Makoto Wada, Kanagawa (JP); Akihiro Kajita, Kanagawa (JP); Kazuyuki Higashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 12/468,504

(22) Filed: May 19, 2009

(65) Prior Publication Data
US 2009/0289281 A1 Nov. 26, 2009

(30) Foreign Application Priority Data
May 20, 2008 (JP) ................. 2008-132289

(51) Int. Cl.
*H01L 29/76* (2006.01)
(52) U.S. Cl. ................. 257/314; 257/E27.103
(58) Field of Classification Search .................. 257/213, 257/288, 314–326, E27.001, E27.009, E27.01, 257/E27.07, E27.081, E27.102, E27.103, 257/E27.104
See application file for complete search history.

(56) References Cited

U.S. PATENT DOCUMENTS
2005/0028125 A1 2/2005 Watanabe et al.
2008/0083990 A1* 4/2008 Hatazaki et al. ............. 257/751
* cited by examiner

*Primary Examiner* — Ha Tran T Nguyen
*Assistant Examiner* — Kevin Quinto
(74) *Attorney, Agent, or Firm* — Oblon, Spivak, McClelland, Maier & Neustadt, L.L.P.

(57) ABSTRACT

A semiconductor device includes a plurality of bit lines repeatedly arranged with a same line width and pitch in a memory device region; a plurality of shunt lines arranged in a same layer as that of the plurality of bit lines, in parallel therewith, and with the same line width and pitch as those of the plurality of bit lines in the memory device region; and an upper-layer contact plug arranged from an upper-layer side so as to be connected to the plurality of shunt lines by extending over two or more shunt lines.

20 Claims, 36 Drawing Sheets

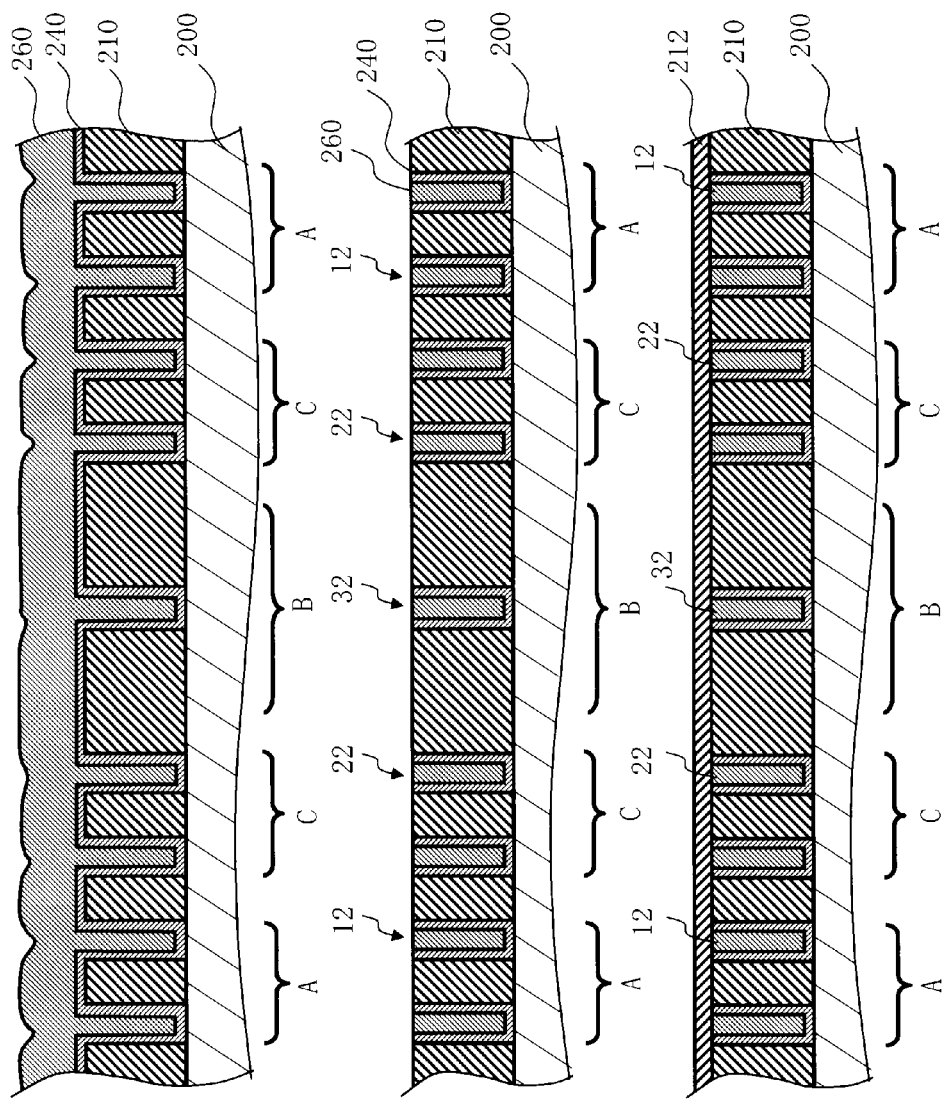

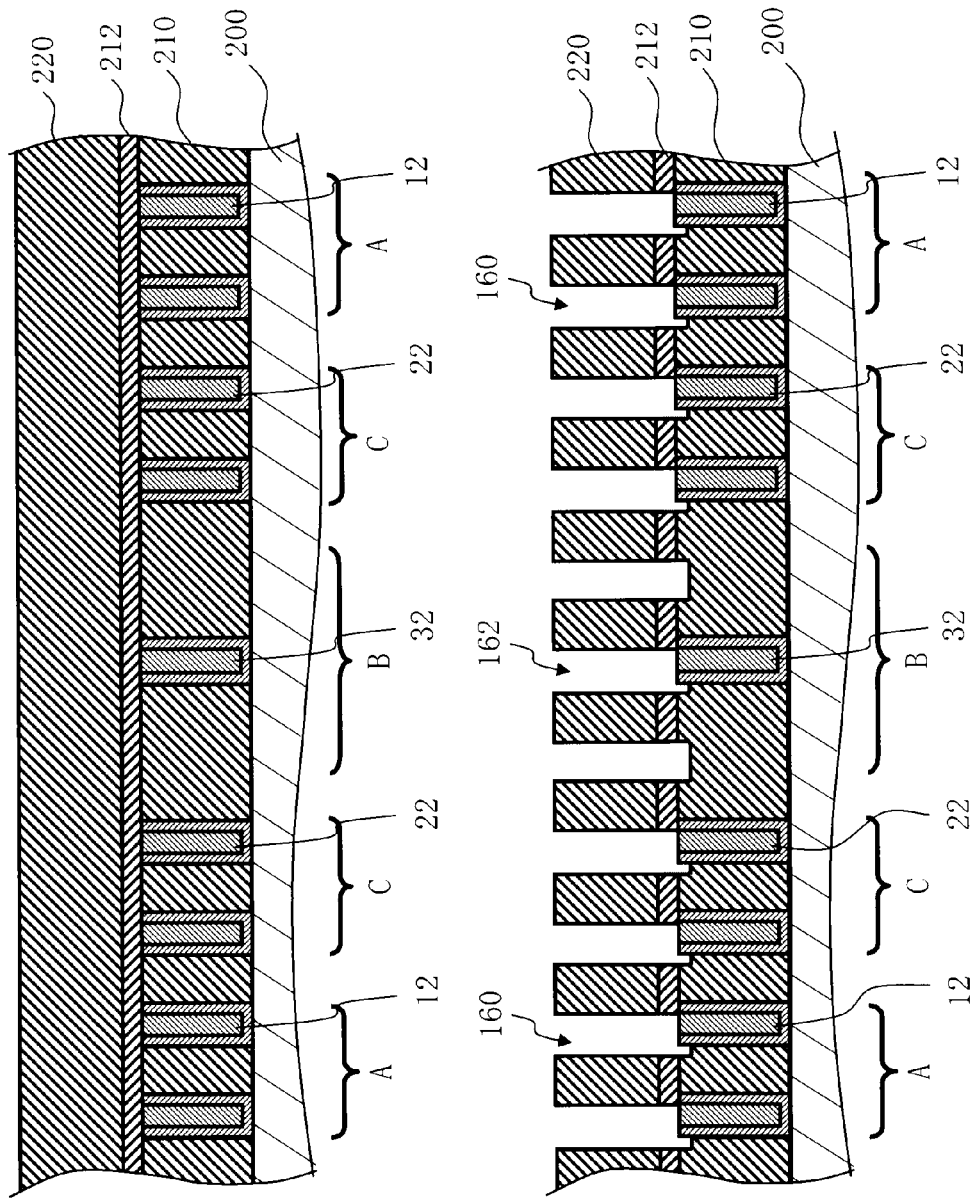

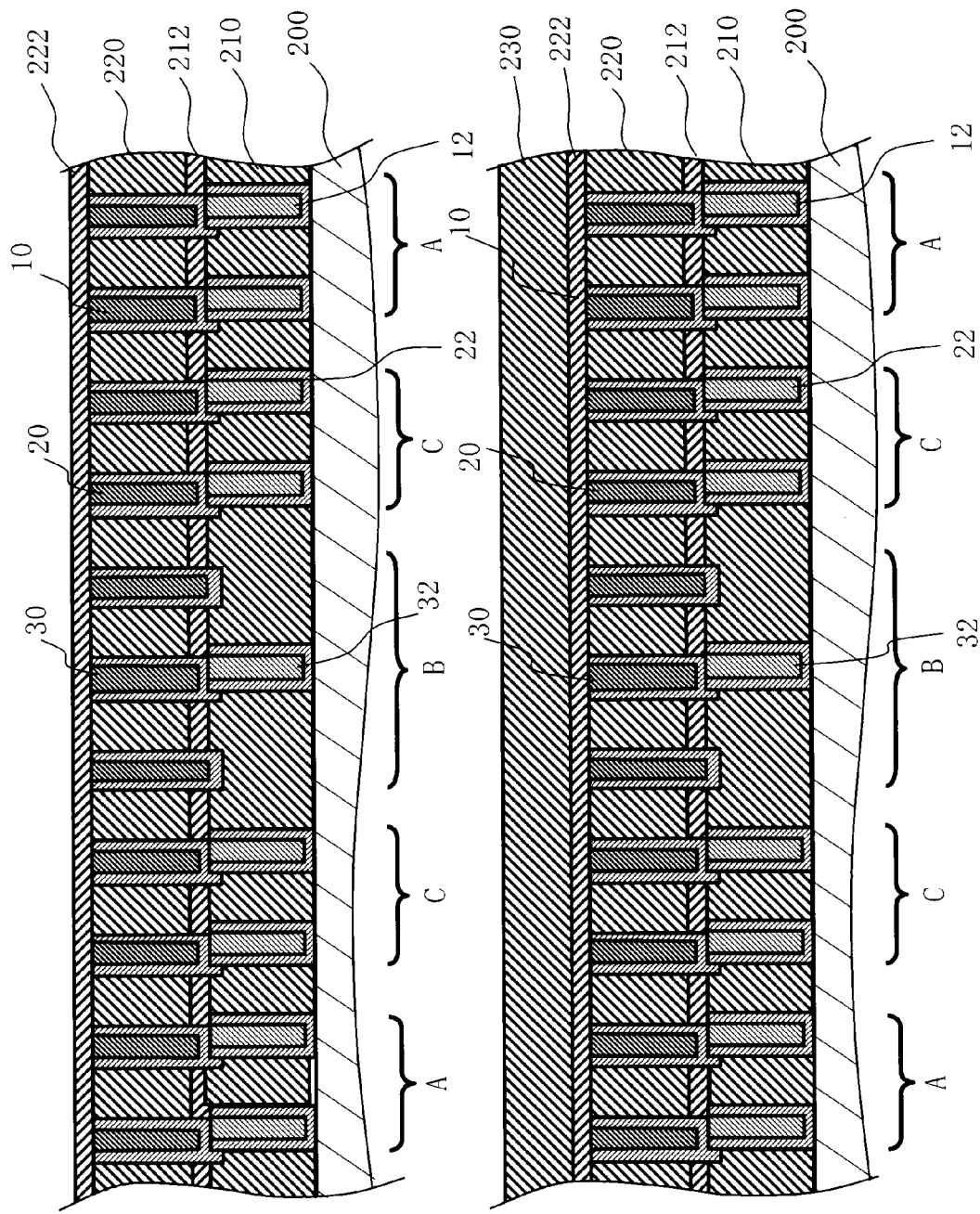

Alignment Deviation Of Upper-Layer Contact

Alignment Deviation Of Upper-Layer Contact

Lower-Layer Contact
Shunt Wire / Upper-Layer Contact

Lower-Layer Contact
Shunt Wire / Upper-Layer Contact

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from prior Japanese Patent Application No. 2008-132289 filed on May 20, 2008 in Japan, the entire contents of which are incorporated herein by reference.

BACKGROUND

In memory devices in general including NAND flash memories, metal wires (bit lines) of the size near a resolution limit of lithography are used in a memory device part. Bit lines in a memory device part are mainly formed by a line & space pattern such that the wire width and the width of a dielectric film are in a one-to-one relation. By using such a one-to-one line & space pattern, a periodically repeated pattern is formed so that lithographic resolution is improved and still finer wire patterns can be formed. In the memory device part, a layout in which a wire called a shunt line is arranged in parallel may be adopted in the one-to-one line & space pattern. The shunt line is a wire used for charging and discharging source lines of a plurality of transistors in the memory device part, and a lower-layer contact plug and an upper-layer contact plug are connected to the shunt line. The shunt line is connected to source lines of the plurality of transistors via the lower-layer contact plug and to a control circuit via the upper-layer contact plug. Since the upper-layer contact plug connected to the shunt line is formed simultaneously with a contact plug used in a peripheral circuit part in the same layer, the diameter thereof becomes larger than that of the bit line. Therefore, the shunt line has been formed with a wire width equal to or thicker than that of the upper-layer contact plug. In this way, the upper-layer contact plug is prevented from being disconnected from the shunt line by making the wire width thicker.

However, if the shunt line is made thicker, periodicity of lithography breaks down, making arrangement of a thick-width shunt line immediately adjacent to a plurality of fine bit lines difficult. Thus, steps such as exercising control to improve periodicity by providing a space between bit lines and a shunt line or maintaining periodicity by arranging an auxiliary pattern on a photo mask have been necessary. However, if a space is provided between bit lines and a shunt line, there is a problem that a chip area increases by an area corresponding to the space. Further, even if such steps are taken, it is currently impossible to completely remove deterioration in contrast of fine wires by a shunt line and deterioration in lithographic resolution. Further, a pattern of several fine wires by a shunt line is more likely to break and thus, such wires cannot be used as bit lines. Therefore, these wires had to be made dummy wires not allowed to operate as a device. Then, if such dummy wires are provided, there is a problem that the chip area increases for the dummy wires.

With higher integration and higher performance in recent years, there is a trend to replace aluminum (Al) alloys conventionally used as a wire material with copper (Cu) or Cu alloys (hereinafter, called Cu together) having lower resistance in the memory device part to achieve high-speed performance of LSI. On the other hand, aluminum (Al) or tungsten (W) is used for the lower-layer contact plug and upper-layer contact plug connected to a shunt line. Here, particularly if Al is used as the plug material, Cu and Al cause an alloy reaction when the Al contact plug and a Cu wire are brought into contact. Therefore, it is necessary to arrange a barrier metal film between the Al contact plug and a Cu wire.

Here, a technology in which a thick-width wire portion to be a sense amplifier in a device portion of a memory array region is formed as two tungsten wires and a connection wire extending over the two tungsten wires is connected to a connector plug to be a communicating path to other wiring layers that fills a through hole formed in a gap portion between the two tungsten wires is disclosed (see Published Unexamined Japanese Patent Application No. 2005-19784, for example). However, this is a technology concerning a sense amplifier connected to bit lines and does not solve problems when a thick-width shunt line is arranged in parallel between a plurality of bit lines.

SUMMARY

A semiconductor device according to an embodiment of the present invention, includes a plurality of bit lines repeatedly arranged with a same line width and pitch in a memory device region; a plurality of shunt lines arranged in a same layer as that of the plurality of bit lines, in parallel therewith, and with the same line width and pitch as those of the plurality of bit lines in the memory device region; and an upper-layer contact plug arranged from an upper-layer side so as to be connected to the plurality of shunt lines by extending over two or more shunt lines.

A method for fabricating a semiconductor device according to an embodiment of the present invention, includes forming an etching stopper film on a first layer obtained by forming a plurality of bit lines repeatedly arranged with a same line width and pitch and a plurality of shunt lines arranged in parallel with the plurality of bit lines and with the same line width and pitch as those of the plurality of bit lines in a first dielectric film in a memory device region, forming a second dielectric film on the etching stopper film, forming an opening at a position over the plurality of shunt lines by cutting through the second dielectric film and the etching stopper film and up to a certain intermediate point on the first dielectric film, etching an upper part of the plurality of shunt lines to make the shunt lines lower than the plurality of bit lines, and embedding a contact material in the opening as if to extend over the plurality of shunt lines made lower than the plurality of bit lines.

A method for fabricating a semiconductor device according to an embodiment of the present invention, includes forming an etching stopper film on a first layer obtained by forming a plurality of bit lines repeatedly arranged with a same line width and pitch and a plurality of shunt lines arranged in parallel with the plurality of bit lines and with the same line width and pitch as those of the plurality of bit lines in a first dielectric film in a memory device region, forming a second dielectric film on the etching stopper film, forming an opening at a position over the plurality of shunt lines by cutting through the second dielectric film and the etching stopper film and up to a certain intermediate point on the first dielectric film, forming a cap film on the plurality of shunt lines selectively, and embedding a contact material in the opening as if to extend over the plurality of shunt lines.

BRIEF DESCRIPTION OF THE DRAWINGS

FIGS. 4A to 4C are process sectional views showing processes performed corresponding to the flow chart in FIG. 2.

FIGS. 5A and 5B are process sectional views showing processes performed corresponding to the flow chart in FIG. 2.

FIGS. 8A and 8B are process sectional views showing processes performed corresponding to the flow chart in FIG. 2.

DETAILED DESCRIPTION OF THE INVENTION

Semiconductor devices in each embodiment that improve lithographic resolution and optical contrast and also reduce a chip area in a memory device region part will be described below.

Embodiment 1

Figure 1:
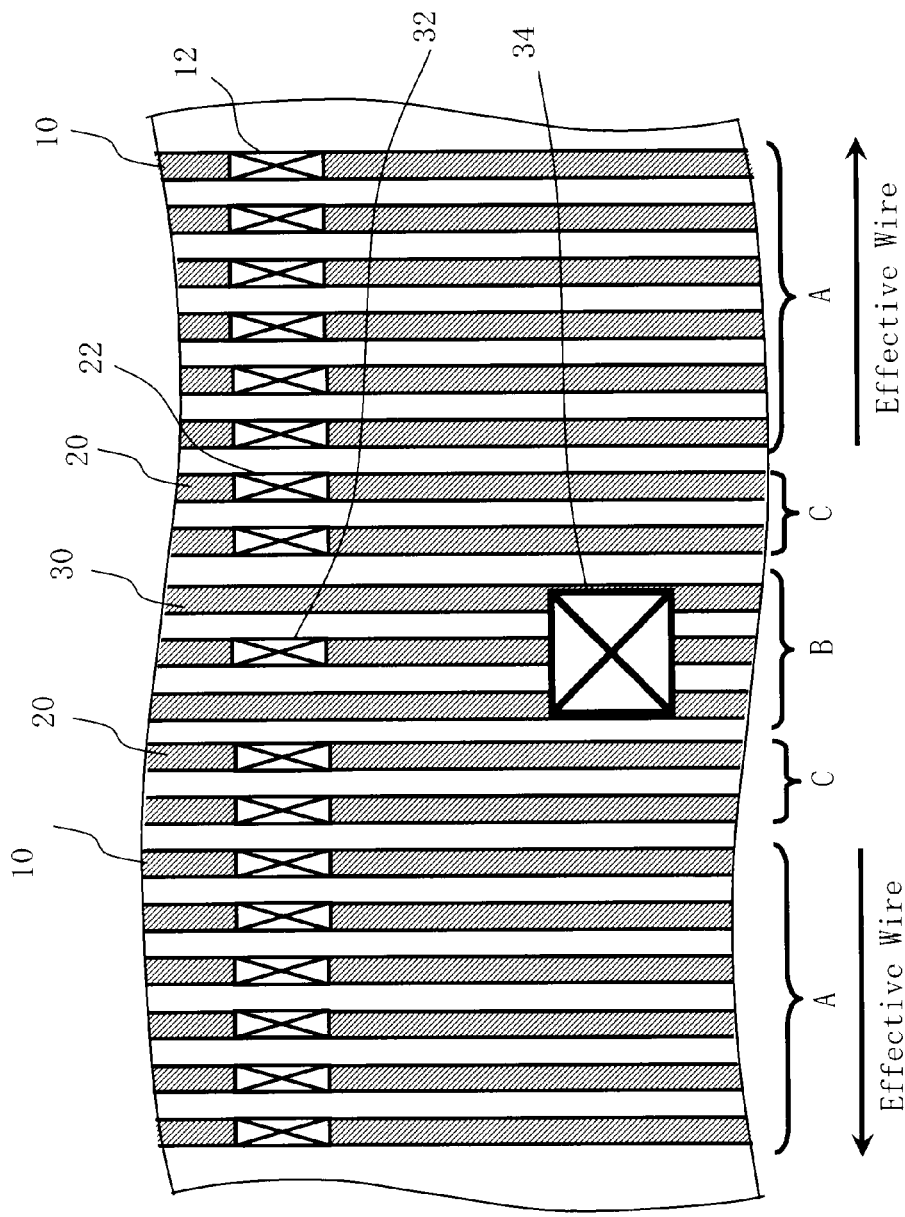
FIG. 1 is a top view showing an example of a configuration of a semiconductor device according to an embodiment 1.

The embodiment 1 will be described below using drawings. FIG. 1 is a top view showing an example of the configuration of a semiconductor device according to the embodiment 1. In FIG. 1, a plurality of bit lines 10 is repeatedly arranged with the same line width and the same pitch in the memory device region. In this case, the bit lines 10 are arranged in a 1:1 line and space pitch. For example, the wire width and space width are formed in the range of 20 to 40 nm. In FIG. 1, the region in which the bit lines 10 are arranged is denoted by "A". This applies also to each figure below.

A plurality of shunt lines 30 is arranged between the plurality of bit lines 10 in the same layer as the plurality of bit lines 10 and in parallel therewith. The plurality of shunt lines 30 is arranged with the same line width and pitch as those of the plurality of bit lines 10. In FIG. 1, the region in which the shunt lines 30 are arranged is denoted by "B". This applies also to each figure below. Moreover, dummy wires 20 are arranged between the bit lines 10 and the shunt lines 30 with the same line width and pitch and in parallel therewith. In FIG. 1, the region in which the dummy wires 20 are arranged is denoted by "C". This applies also to each figure below. An upper-layer contact plug 34 is arranged from an upper-layer side of the plurality of shunt lines 30 so as to connect the plurality of shunt lines 30 by extending over the shunt lines 30. Since, as described above, the upper-layer contact plug 34 is formed simultaneously with a contact plug used in a peripheral circuit part in the same layer, the diameter thereof is larger than the line width of the bit lines 10. Thus, the upper-layer contact plug 34 is connected to the plurality of shunt lines 30 in such a way that the line width of at least one shunt line 30 is completely contained in the upper-layer contact plug 34. Since shunt lines are conventionally formed with a wire width thicker than the diameter of the upper-layer contact plug 34, periodicity of lithography breaks down, but with the configuration in the embodiment 1, periodicity of lithography can be maintained. Thus, the space between the bit lines 10 and the shunt lines 30 that conventionally requires, for example, 200 nm or more can be made unnecessary. As a result, the chip area in the memory device region can be reduced by an area corresponding to the space. Further, periodicity of fine wiring patterns is always maintained constant and thus, optical contrast and lithographic resolution can be improved on both sides of the shunt lines 30.

Shunt lines are conventionally made thick wires and deterioration in lithographic resolution and that in optical contrast are suffered and thus, several fine wires by the shunt wires need to be made dummy wires. In the configuration according to the embodiment 1, however, deterioration in lithographic resolution and that in optical contrast are not suffered and pattern breakdown disappears or is suppressed compared with conventional patterns. Thus, the dummy wires 20 need to be arranged by considering only a misalignment (alignment deviation) of the upper-layer contact plug 34. The misalignment distance of contact is much smaller compared with a region in which deterioration in lithographic resolution and optical contrast conventionally occurs. Thus, the number of the dummy wires 20 in the embodiment 1 can be reduced from that of the dummy wires 20 conventionally needed. As a result, the chip area in the memory device region can be further reduced by a space between the reduced dummy wires 20.

In FIG. 1, three shunt lines 30 are arranged as an example, but the number of the shunt lines 30 is not limited to this. The number needs to be only two or more. Since the shunt lines 30 are arranged with the same line width and pitch as those of the bit lines 10 and thus, the number thereof may be adjusted by fitting to the line width and pitch of the bit lines 10 when necessary. A plurality of the shunt lines 30 are suitably arranged in such a way that the total of the line width of all the shunt lines 30 and each space width between the shunt lines 30 is equal to or larger than the diameter of the upper-layer contact plug 34.

In FIG. 1, a plurality of lower-layer contact plugs for bit line 12 is arranged in the same position regarding the direction in which wires extend so as to be connected to the plurality of bit lines 10 from the lower-layer side. Then, a lower-layer contact plug for shunt line 32 is arranged from the lower-layer side by being fitted in the position so as to be connected to one of the plurality of shunt lines 30. In FIG. 1, the lower-layer contact plug for shunt line 32 is connected to the center shunt line 30 of the three shunt lines 30, but the present embodiment is not limited to this. The lower-layer contact plug for shunt line 32 may be connected to the other shunt line 30. The lower-layer contact plug 32 is connected to source lines of a plurality of transistors in the memory device part. The lower-layer contact plug 32 may be connected directly or another wire may be arranged in the lower layer so that the lower-layer contact plug 32 is connected to source lines of the plurality of transistors in the memory device part via the lower-layer wire. In FIG. 1, a lower-layer contact plug for dummy wire 22 is arranged by being fitted in the position of the lower-layer contact plug for bit line 12 for each of the dummy wires 20 from the lower-layer side. It is needless to say that the lower-layer contact plug for dummy wire 22 is dummy and is not electrically connected to the circuit so that an operation of the memory circuit is not affected.

Thus, lower-layer contact plugs are substantially periodically arranged in the same positions for the bit line 10, the dummy wire 20, and the shut line 30. If these lower-layer contact plugs 12, 22, and 32 are formed simultaneously, periodicity of patterns is almost constant and thus, lithographic resolution and optical contrast of adjacent contact can be improved. There is a large space between a dummy wire and a thick-width shunt line in a conventional configuration and thus, the resolution of shunt part contact is not affected. On the other hand, there is no large space between the dummy wire 20 and the shunt line 30 and fine wires of the shunt part are adjacent to the dummy wire 20 and thus, forming the lower-layer contact plug 22 below the dummy wire 20 is effective not only for the lower-layer contact plug 12 for the bit line 10, but also for the lower-layer contact plug 32 for the shunt line 30 in improving lithographic resolution.

Figure 2:
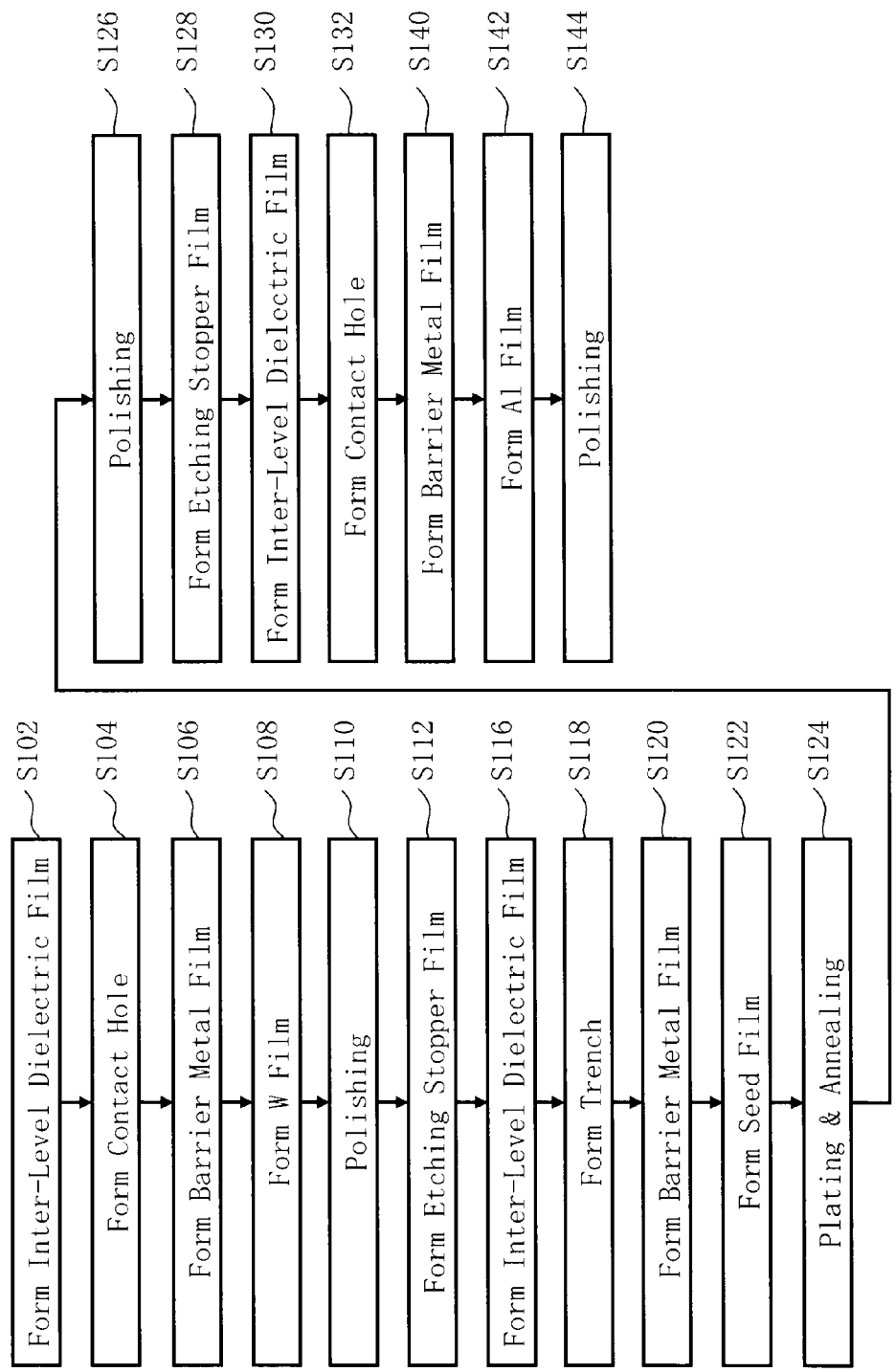
FIG. 2 is a flowchart showing principal parts of a method for fabricating a semiconductor device according to the embodiment 1.

FIG. 2 is a flow chart showing principal parts of a method for fabricating a semiconductor device according to the embodiment 1. In FIG. 2, the method for fabricating a semiconductor device according to the embodiment 1 performs a series of processes including an inter-level dielectric film formation process (S102), contact hole formation process (S104), barrier metal film formation process (S106), tungsten (W) film formation process (S108), polishing process (S110), etching stopper film formation process (S112), inter-level dielectric film formation process (S116), trench formation process (S118), barrier metal film formation process (S120), seed film formation process (S122), plating and annealing process (S124), polishing process (S126), etching stopper film formation process (S128), inter-level dielectric film formation process (S130), contact hole formation process (S132), barrier metal film formation process (S140), aluminum (Al) film formation process (S142), and polishing process (S144).

Figure 3A:
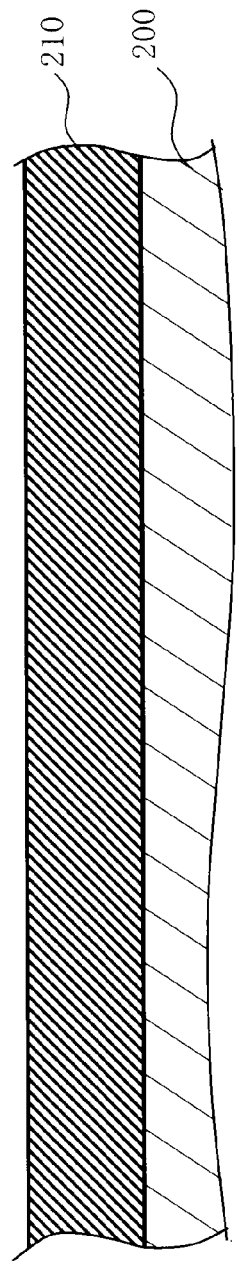
FIGS. 3A to 3C are process sectional views showing processes performed corresponding to the flow chart in FIG. 2.
Figure 3B:
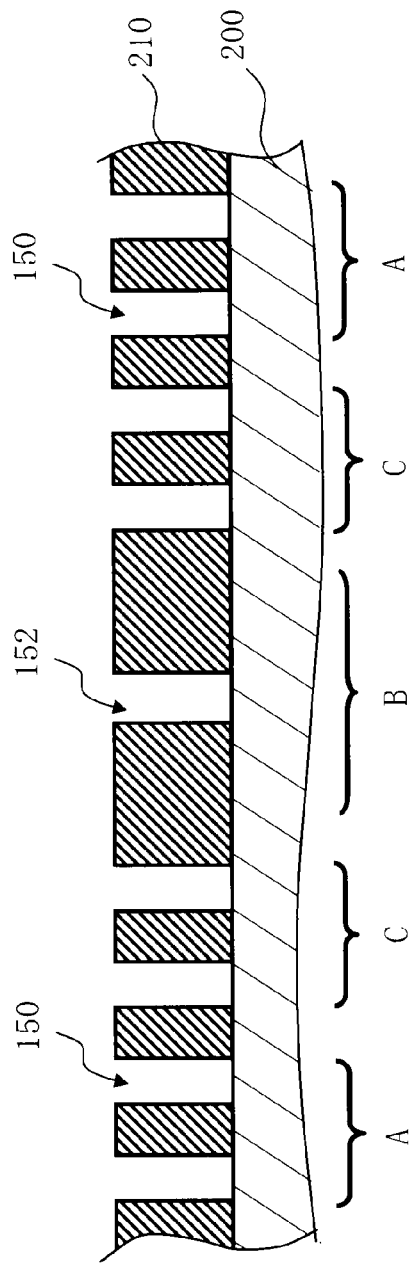
Figure 3C:
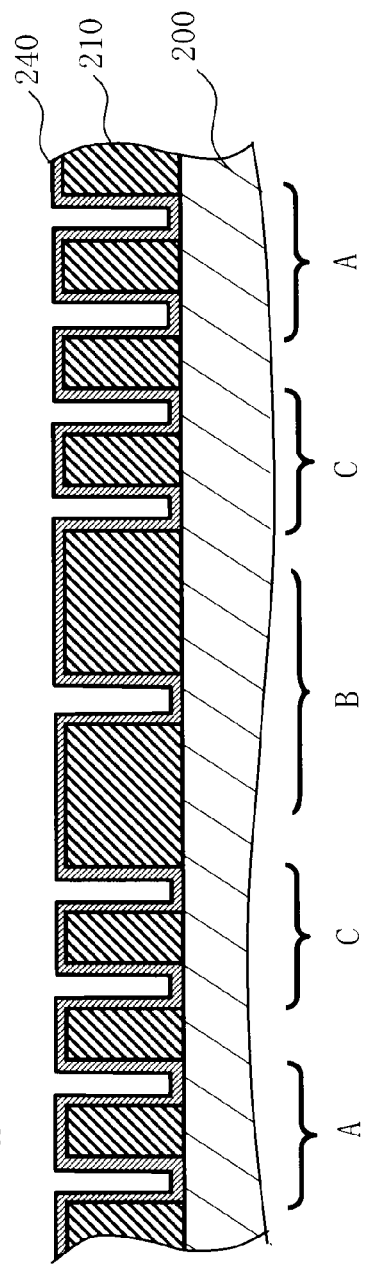

FIGS. 3A to 3C show, among process sectional views showing processes performed corresponding to the flow chart in FIG. 2, the inter-level dielectric film formation process (S102) to the barrier metal film formation process (S106).

In FIG. 3A, as the inter-level dielectric film formation process (S102), an inter-level dielectric film 210 is formed on the surface of a substrate 200 on which a portion such as a transistor and capacitor in a memory device is formed by the CVD (chemical vapor deposition) method to a thickness of, for example, 200 nm. TEOS-SiO$_2$ (Tetraethoxysilane-SiO$_2$), for example, is suitable as the material of the inter-level dielectric film 210. Here, the CVD method is used for film formation, but other methods may also be used. A silicon wafer of, for example, 300 mm is used as the substrate 200. Here, a device portion such as a transistor and capacitor is not illustrated. Other wires or peripheral circuits may also be formed on the substrate 200.

In FIG. 3B, as the contact hole formation process (S104), openings 150 and 152 cut through to the substrate 200, which are a contact hole structure for connection to the device portion in lithography and dry etching processes, are formed in the inter-level dielectric film 210. For example, the openings 150 and 152 of 30 nm in diameter and 200 nm in depth are formed. The openings 150 and 152 can be formed substantially perpendicularly to the surface of the substrate 200 by removing the exposed inter-level dielectric film 210 by the anisotropic etching method from the substrate 200 where, though not shown, a resist film is formed on the inter-level dielectric film 210 by undergoing the lithographic process such as a resist application process and exposure process. For example, the openings 150 and 152 may be formed, as an example, by reactive ion etching. Here, the opening 150 is a contact hole for bit line or dummy wire and the opening 152 a contact hole for shunt line. Since lower-layer contact plugs are substantially periodically arranged in the same positions for the bit line 10, the dummy wire 20, and the shut line 30 in the embodiment 1 and thus, periodicity of patterns is almost constant. Therefore, when the openings 150 and 152 are formed simultaneously, lithographic resolution and optical contrast can be improved.

In FIG. 3C, as the barrier metal film formation process (S106), a barrier metal film 240 using a barrier metal material is formed on inside surfaces of the openings 150 and 152 formed by etching and the surface of the inter-level dielectric film 210. The barrier metal film 240 is formed by depositing a titanium nitride (TiN) in a sputtering device using a sputter process to a thickness of, for example, 5 nm. The deposition method of the barrier metal material is not limited to the PVD method and the atomic layer chemical vapor deposition method and CVD method may also be used. The coverage factor can thereby be made better compared when the PVD method is used. In addition to TiN, tantalum (Ta), titanium (Ti), tantalum nitride (TaN), or a laminated film combining these such as Ti and TiN may be used as the material of the barrier metal.

FIGS. 4A to 4C show, among process sectional views showing processes performed corresponding to the flow chart in FIG. 2, the tungsten (W) film formation process (S108) to the etching stopper film formation process (S112).

In FIG. 4A, as the W film formation process (S108), a W film 260 of the thickness of, for example, 400 nm is formed inside the openings 150 and 152 where the barrier metal film 240 is formed and on the surface of the substrate 200 by the CVD method to fill the openings 150 and 152 with the W film 260. Here, in addition to W, Al or Cu may also be suitably used.

In FIG. 4B, as the polishing process (S110), the excessive W film 260 and barrier metal film 240 bulging out of the openings 150 and 152 of the substrate 200 are polished for planarization. The lower-layer contact plugs 12, 22, and 32 shown in FIG. 1 can thereby be formed.

In FIG. 4C, as the etching stopper film formation process (S112), an etching stopper film 212 is formed on the lower-layer contact plugs 12, 22, and 32 and the inter-level dielectric film 210 by the CVD method to a thickness of, for example, 20 to 50 nm. As a material of the etching stopper film 212, silicon nitride (SiN), silicon nitrocarbide (SiCN), or silicon nitrooxide (SiON) can be used. The etching stopper film 212 is used as an etching stopper during trench formation or contact hole formation for upper-layer contact described later.

FIGS. 5A and 5B show, among process sectional views showing processes performed corresponding to the flow chart in FIG. 2, the inter-level dielectric film formation process (S116) to the trench formation process (S118).

In FIG. 5A, as the inter-level dielectric film formation process (S116), an inter-level dielectric film 220 is formed on the etching stopper film 212 by the CVD method to a thickness of, for example, 50 nm. As a material of the inter-level dielectric film 220, for example, $SiO_2$ or a low dielectric constant (low-k) material can suitably be used. By using the low-k material, the relative dielectric constant can be reduced from about 4.2 to 3.5 or below compared with a case when an $SiO_2$ film is used. Accordingly, parasitic capacitance between wires can be reduced. As a low-k material, at least one material selected from a group consisting of a film having siloxane backbone structures such as polymethyl siloxane, polysiloxane, hydrogen silsesquioxane, and methyl silsesquioxane, a film having organic resin as a main component such as polyarylene ether, polybenzo oxazole, and polybenzo cyclobutene, and a porous film such as a porous silica film can be used. The inter-level dielectric film 220 using such low-k materials, a low dielectric constant of less than 2.5 can be obtained. As a formation method other than the CVD method, for example, the SOD (spin on dielectric coating) method by which a thin film is formed by spin coating and heat treatment of a solution can be used. For example, a low-k film can be formed by forming a wafer by a spinner, baking the wafer on a hot plate in a nitrogen atmosphere, and finally curing the wafer on the hot plate at temperature higher than the baking temperature in the nitrogen atmosphere. A porous dielectric film having predetermined property values can be obtained by appropriately adjusting the low-k material and formation conditions.

In FIG. 5B, as the trench formation process (S118), openings 160 and 162, which are a trench structure for connection to the lower-layer contact plugs in the lithography and dry etching processes, are formed in the inter-level dielectric film 220 using the etching stopper film 212 as an etching stopper. For example, the openings 160 and 162 of the wire width 30 nm and the depth 50 nm are formed. The openings 160 and 162 can be formed substantially perpendicularly to the surface of the substrate 200 by removing the exposed inter-level dielectric film 220 by the anisotropic etching method from the substrate 200 where, though not shown, a resist film is formed on the inter-level dielectric film 220 by undergoing the lithographic process such as a resist application process and exposure process. For example, the openings 160 and 162 may be formed, as an example, by reactive ion etching. Then, after the openings 160 and 162 being formed in the inter-level dielectric film 220, the inter-level dielectric film 220 can be cut through to the lower-layer contact plugs 12, 22, and 32 by etching the etching stopper film 212. Here, a case in which a slight misalignment occurs on purpose is shown. Since the bit line 10, the dummy wire 20, and the shunt line 30 are all laid out as a 1:1 line & space pattern in the embodiment 1, periodicity of patterns is constant. Therefore, when the openings 160 and 162 are formed simultaneously, as described above, lithographic resolution and optical contrast can be improved. Here, the opening 160 is a trench for bit line or dummy wire and the opening 162 a trench for shunt line.

Figures 6A, 6B:
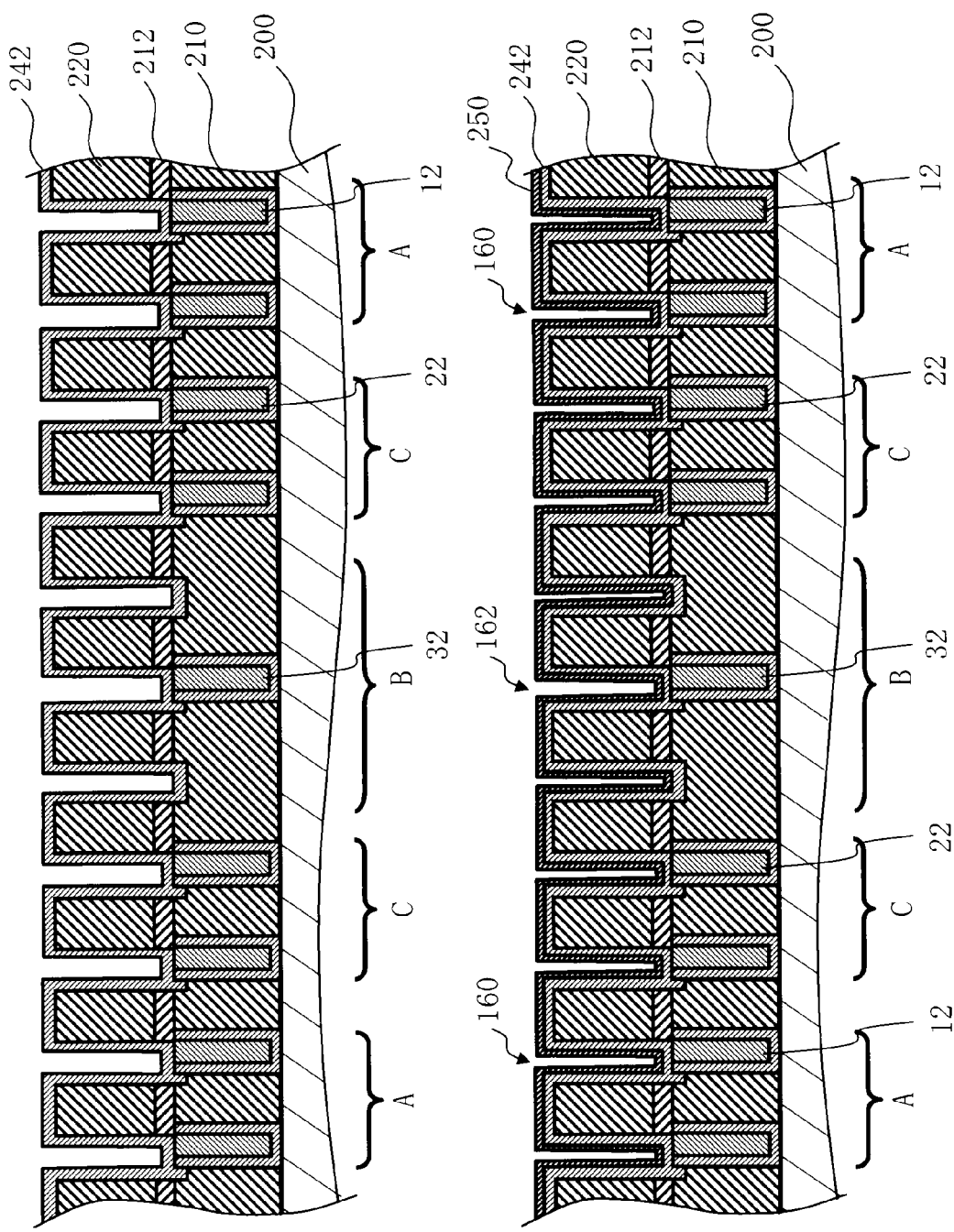
FIGS. 6A and 6B are process sectional views showing processes performed corresponding to the flow chart in FIG. 2.

FIGS. 6A and 6B show, among process sectional views showing processes performed corresponding to the flow chart in FIG. 2, the barrier metal film formation process (S120) to the seed film formation process (S122).

In FIG. 6A, as the barrier metal film formation process (S120), a barrier metal film 242 using a barrier metal material is formed on inside surfaces of the openings 160 and 162 formed by etching and the surface of the inter-level dielectric film 220. The barrier metal film 242 is formed by depositing a Ti film in a sputtering device using a sputter process to a thickness of, for example, 5 nm. The deposition method of the barrier metal material is not limited to the PVD method and the atomic layer chemical vapor deposition method and CVD method may also be used. The coverage factor can thereby be made better compared when the PVD method is used. In addition to Ti, Ta, ruthenium (Ru), manganese (Mn), TaN, TiN, ruthenium nitride (RuN), manganese nitride (MnN), or a laminated film combining these such as Ti and TiN may be used as the material of the barrier metal film.

In FIG. 6B, as the seed film formation process (S122), a Cu thin film to be a cathode electrode in the next process, the electro-plating process, is deposited (formed) as a seed film 250 on inside surfaces of the openings 160 and 162 and the surface of the substrate 200 where the barrier metal film 242 is formed by the physical vapor deposition (PVD) method such as the sputter process. The deposition method of the seed film is not limited to the PVD method and the atomic layer chemical vapor deposition method and CVD method may also be used.

Figures 7A, 7B:
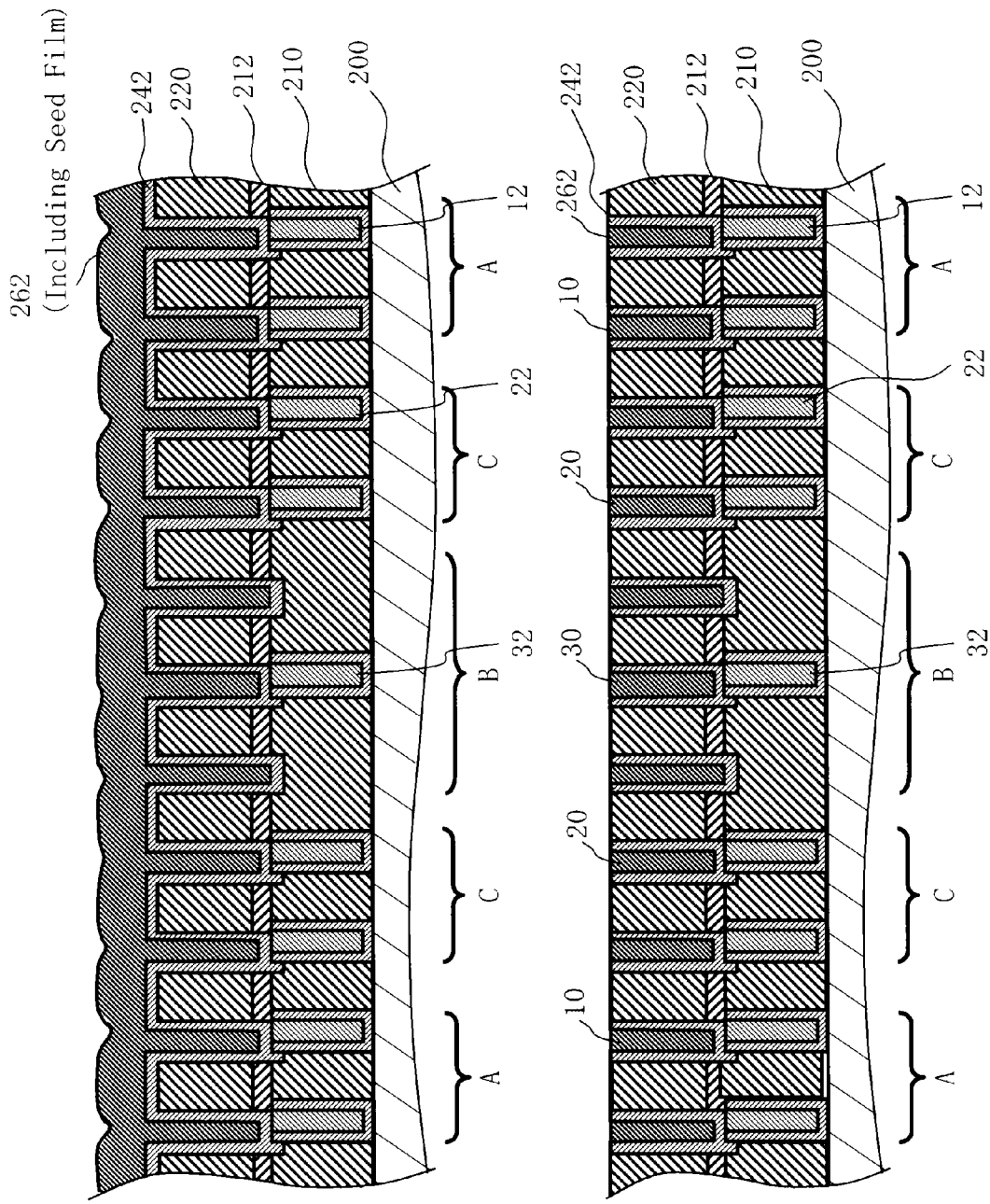
FIGS. 7A and 7B are process sectional views showing processes performed corresponding to the flow chart in FIG. 2.

FIGS. 7A and 7B show, among process sectional views showing processes performed corresponding to the flow chart in FIG. 2, the plating & annealing process (S124) to the polishing process (S126).

In FIG. 7A, as the plating & annealing process (S124) a Cu film 262, which becomes an example of conductive material by the electrochemical growth method such as electro-plating, is deposited in the openings 160 and 162 and on the surface of the substrate 200 where the seed film 250 is formed using the seed film 250 as a cathode electrode. Here, the Cu film 262 is deposited to a thickness of, for example, 1000 nm and then annealing is performed.

In FIG. 7B, as the polishing process (S126), the surface of the substrate 200 is polished by the CMP method to remove the Cu film 262 including the seed film 250 to be a wiring layer deposited on the surface excluding the openings and the barrier metal film 242 by polishing. In this manner, the conductive material is made to be selectively left in the openings 160 and 162 on whose inside surface the barrier metal film 242 is formed by polishing the conductive material. As a result, as shown in FIG. 7B, the substrate 200 can be planarized. With the processes described above, the plurality of bit lines 10, the plurality of dummy wires 20, and the plurality of shunt lines 30 arranged in a 1:1 line & space pattern in parallel can be simultaneously formed.

FIGS. 8A and 8B show, among process sectional views showing processes performed corresponding to the flow chart in FIG. 2, the etching stopper film formation process (S128) to the inter-level dielectric film formation process (S130).

In FIG. 8A, as the etching stopper film formation process (S128), an etching stopper film 222 is formed on the plurality of bit lines 10, the plurality of dummy wires 20, and the plurality of shunt lines 30 and on the inter-level dielectric film 220 by the CVD method to a thickness of, for example, 50 to 100 nm. SiN, SiCN, or SiON can be used as the material of the etching stopper film 222. The etching stopper film 222 can be used as an etching stopper during contact hole formation for upper-layer contact described later.

In FIG. 8B, as the inter-level dielectric film formation process (S130), an inter-level dielectric film 230 is formed on the etching stopper film 222 by the CVD method to a thickness of, for example, 200 nm. $SiO_2$, for example, is suitably used as the material of the inter-level dielectric film 230. The CVD method is used here for film formation, but other methods may also be used.

Figure 9:
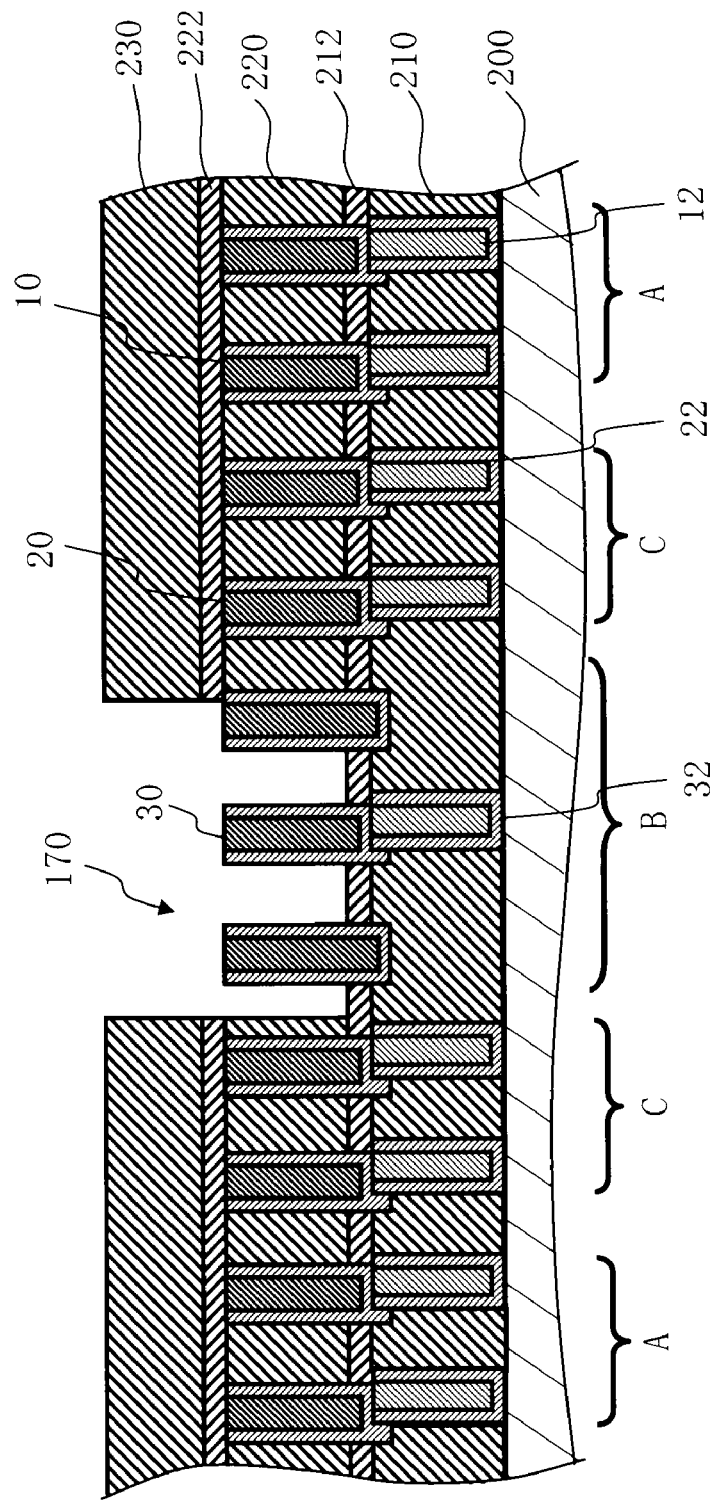
FIG. 9 is a process sectional view showing a process performed corresponding to the flow chart in FIG. 2.

FIG. 9 shows, among process sectional views showing processes performed corresponding to the flow chart in FIG. 2, the contact hole formation process (S132).

In FIG. 9, as the contact hole formation process (S132), an opening 170 cut through to the etching stopper film 212, which is a contact hole structure for connection to the plurality of shunt lines 30 in the lithography and dry etching processes, is formed in the inter-level dielectric films 230 and 220 and the etching stopper film 222. For example, the opening 170 of 150 nm in diameter and 300 nm in depth is formed.

The opening 170 can be formed substantially perpendicularly to the surface of the substrate 200 by removing the exposed inter-level dielectric film 230 by the anisotropic etching method from the substrate 200 where, though not shown, a resist film is formed on the inter-level dielectric film 230 by undergoing the lithographic process such as the resist application process and exposure process. For example, the opening 170 may be formed, as an example, by reactive ion etching. Here, after the inter-level dielectric film 230 and the etching stopper film 222 being etched, the inter-level dielectric film 220 is etched using the etching stopper film 212 as an etching stopper.

Here, the inter-level dielectric film 230 is etched using the etching stopper film 222 as an etching stopper. Thereafter, the inter-level dielectric film 220 may be etched up to a certain intermediate point thereof by over-etching the etching stopper film 222. However, doing so may cause a problem described below.

Figure 10:
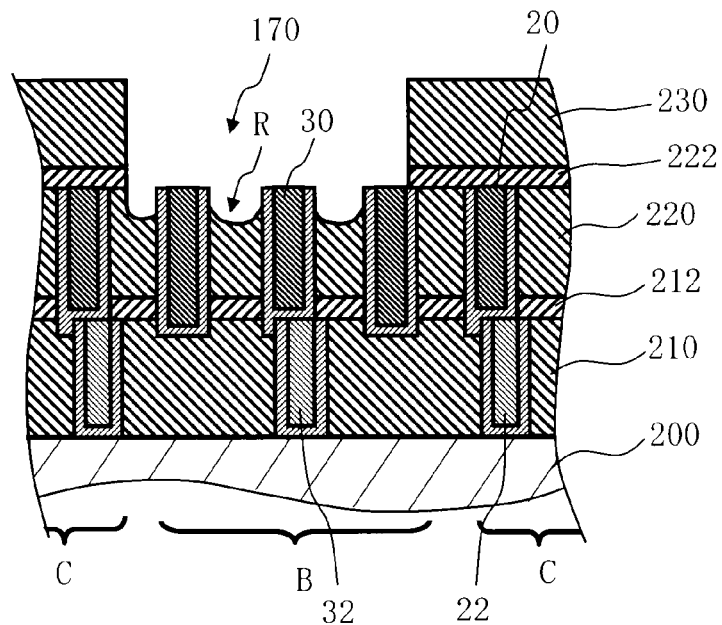
FIG. 10 is a diagram showing an example of a surface shape of an inter-level dielectric film when etching is stopped at some intermediate point on the inter-level dielectric film.

FIG. 10 is a diagram showing an example of a surface shape of an inter-level dielectric film when etching is stopped at some intermediate point on the inter-level dielectric film.

If etching is stopped at some intermediate point on the inter-level dielectric film 220, as shown in FIG. 10, the surface of the inter-level dielectric film 220 positioned at the bottom of the opening 170 may become a non-uniform curved surface shape R. The upper-layer contact plug 34 is connected to the shunt line 30, and the shunt line 30 has Cu as a material and the upper-layer contact plug 34 has Al as a material. Thus, if Cu and Al are brought into contact directly, the alloy reaction described above occurs, leading to an occurrence of voids and the like. Thus, a barrier metal film described later is formed between Cu and Al. When the barrier metal film is formed, the film is less likely to run out if the bottom of the opening 170 to be a contact hole is ideally flat and further, the height of the bottom of the contact hole is uniform for each of the shunt lines 30. If the film runs out somewhere and there is a location where there is no barrier metal film, Cu and Al could come directly into contact. Thus, it is desirable to form the barrier metal film in such a way that the film does not run out. However, as shown in FIG. 10, if the surface of the inter-level dielectric film 220 has the non-uniform curved surface shape R, there is a possibility that the barrier metal film runs out. Thus, in the embodiment 1, the inter-level dielectric film 220 is cut through to the etching stopper film 212 using the etching stopper film 212 as an etching stopper, instead of stopping etching at some intermediate point on the inter-level dielectric film 220. Accordingly, the inter-level dielectric film 220 at the bottom of the opening 170 can be completely removed. Therefore, the flat etching stopper film 212 is exposed at the bottom of the opening 170. Moreover, the height of the etching stopper film 212 is uniform for each of the shunt lines 30. Therefore, the barrier metal film can be formed in such a way that the film does not run out. The bottom shape of the opening 170 formed when etching is stopped at some intermediate point on the inter-level dielectric film is not limited to this. Another case will be described below.

Figure 11:
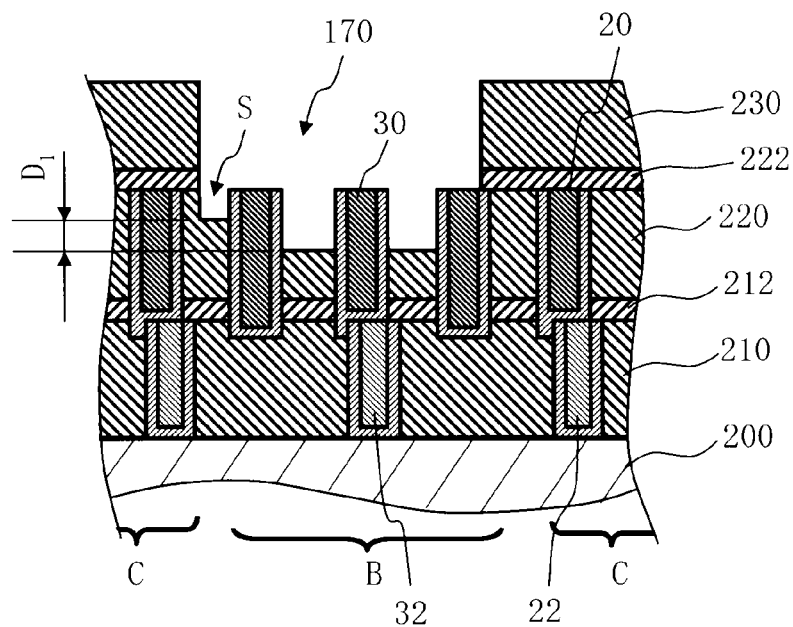
FIG. 11 is a diagram showing another example of the surface shape of the inter-level dielectric film when etching is stopped at some intermediate point on the inter-level dielectric film.

FIG. 11 is a diagram showing another example of the surface shape of the inter-level dielectric film when etching is stopped at some intermediate point on the inter-level dielectric film.

If etching is stopped at some intermediate point on the inter-level dielectric film 220, as shown in FIG. 11, the surface of the inter-level dielectric film 220 positioned at the bottom of the opening 170 may become non-uniform. Particularly, the bottom (slit S) of the opening 170 on the external side of the shunt line 30 at the edge caused by a misalignment between the shunt line 30 and the opening 170 is more likely to be higher than that of the opening 170 between the shunt lines 30. In FIG. 11, a level difference thereof is indicated by D1. An external region of the shunt line 30 at the edge is more likely to be narrower than a region between the shunt lines 30, leading to a slower etching speed. Thus, the above level difference is generated. Therefore, if the height of the bottoms of contact holes is not uniform, there is a possibility that the film runs out. If the film runs out somewhere and there is a location where there is no barrier metal film, Cu and Al could come directly into contact. Thus, in the embodiment 1, the inter-level dielectric film 220 is cut through to the etching stopper film 212 using the etching stopper film 212 as an etching stopper, instead of stopping etching at some intermediate point on the inter-level dielectric film 220. Accordingly, the inter-level dielectric film 220 at the bottom of the opening 170 can be completely removed. Consequently, the level difference due to a difference of the bottom position of the opening 170 can be eliminated for planarization. Therefore, the barrier metal film can be formed in such a way that the film does not run out. Moreover, etching control can be made easier by performing etching to cut through the inter-level dielectric film 220 to the etching stopper film 212 rather than stopping etching at some intermediate point on the inter-level dielectric film 220.

Figure 12:
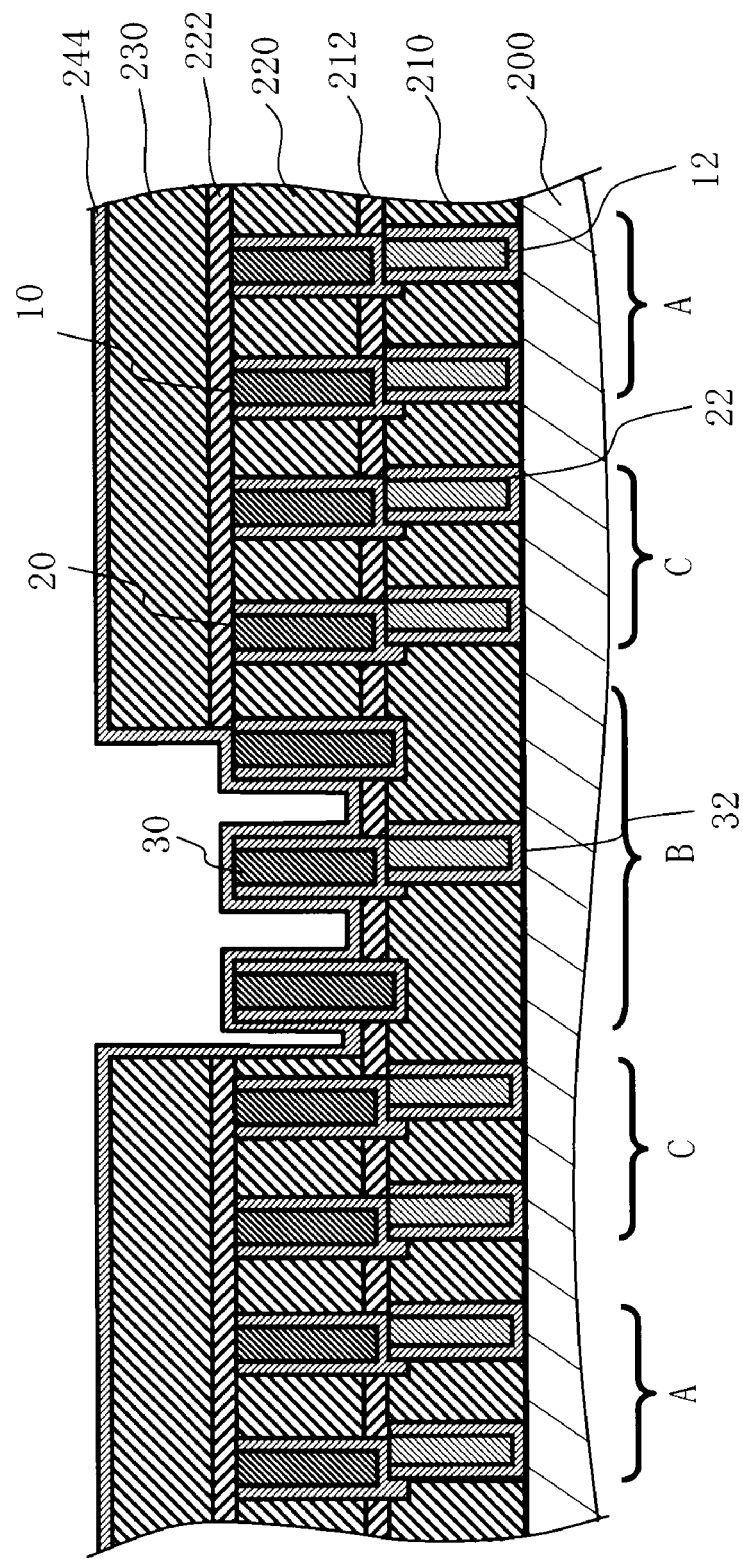
FIG. 12 is a process sectional view showing a process performed corresponding to the flow chart in FIG. 2.

FIG. 12 shows, among process sectional views showing processes performed corresponding to the flow chart in FIG. 2, the barrier metal film formation process (S140).

In FIG. 12, as the barrier metal film formation process (S140), a barrier metal film 244 using a barrier metal material is formed on inside surfaces of the opening 170 formed by etching and the surface of the inter-level dielectric film 230. The barrier metal film 244 is formed by depositing a TiN film in a sputtering device using a sputter process to a thickness of, for example, 5 nm. The deposition method of the barrier metal material is not limited to the PVD method and the atomic layer chemical vapor deposition method and CVD method may also be used. The coverage factor can thereby be made better compared when the PVD method is used. In addition to TiN, Ta, Ti, TaN, or a laminated film combining these such as Ti and TiN may be used as the material of the barrier metal film. Here, the barrier metal film 244 can also be formed by selecting suitable conditions even if the inter-level dielectric film 220 is formed into a shape as shown in FIG. 10 or FIG. 11.

Figure 13:
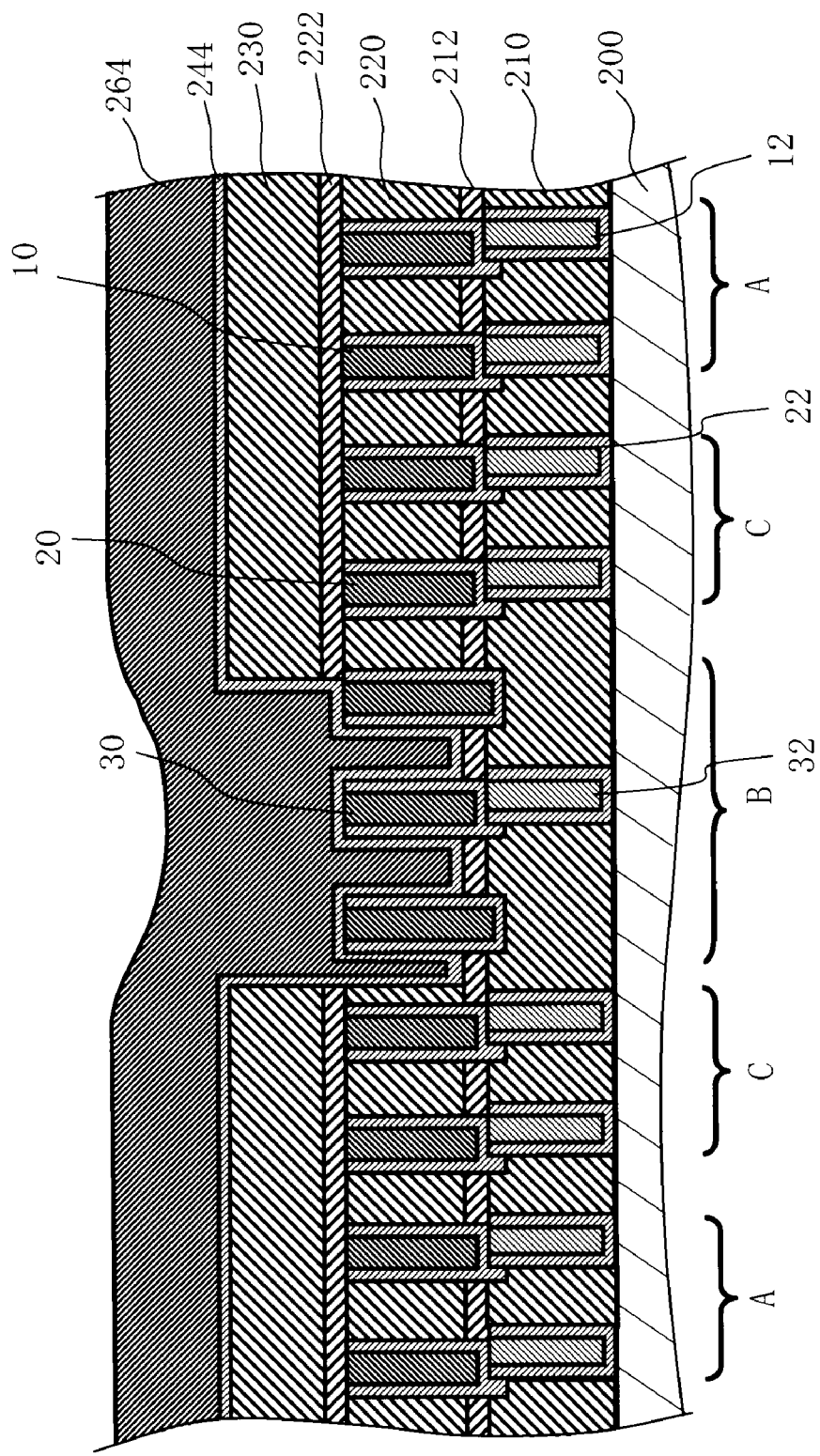
FIG. 13 is a process sectional view showing a process performed corresponding to the flow chart in FIG. 2.

FIG. 13 shows, among process sectional views showing processes performed corresponding to the flow chart in FIG. 2, the aluminum (Al) film formation process (S142).

In FIG. 13, as the Al film formation process (S142) an Al film 264 of the thickness of, for example, 1000 nm is formed inside the opening 170 where the barrier metal film 244 is formed and on the surface of the substrate 200 by the PVD method to fill the opening 170 with the Al film 264. Here, in addition to Al, W or Cu may also be used. The film formation method is not limited to the PVD method and the CVD method or the like can also be used.

Figure 14:
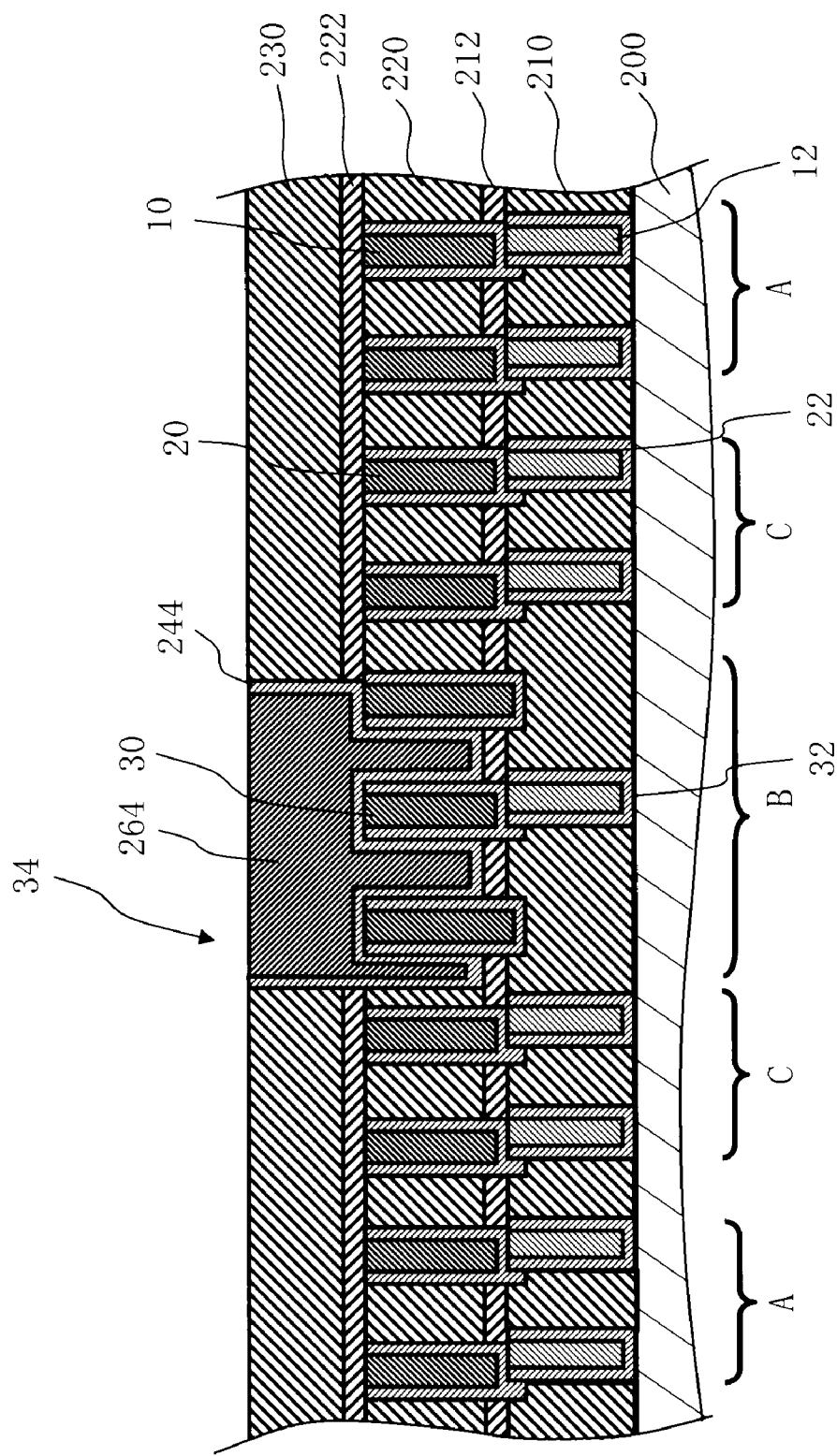
FIG. 14 is a process sectional view showing a process performed corresponding to the flow chart in FIG. 2.

FIG. 14 shows, among process sectional views showing processes performed corresponding to the flow chart in FIG. 2, the polishing process (S144).

In FIG. 14, as the polishing process (S144), the excessive Al film 264 and barrier metal film 244 bulging out of the opening 170 of the substrate 200 are polished using the CMP method for planarization. The upper-layer contact plug 34 shown in FIG. 1 can thereby be formed.

In a semiconductor device according to the embodiment 1, as described above, the etching stopper film 212 (first dielectric film) is arranged on the side surface side of a plurality of bit lines 10. Then, the inter-level dielectric film 220 (second dielectric film), which is a different type of film from that of the etching stopper film 212, is arranged on the etching stopper film 212 and on the side surface side of each of the plurality of bit lines 10. Then, the barrier metal film 244 is arranged at least in contact with the etching stopper film 212 at the bottom surface of the barrier metal film 244. Then, the upper-layer contact plug 34 is arranged on the barrier metal film 244. Since the side surface and upper surface of the shunt line 30 projecting from the etching stopper film 212 are covered with the barrier metal film 244, contact of Al as a material of the upper-layer contact plug 34 and Cu as a material of the shunt line 30 can be avoided.

Figure 15:
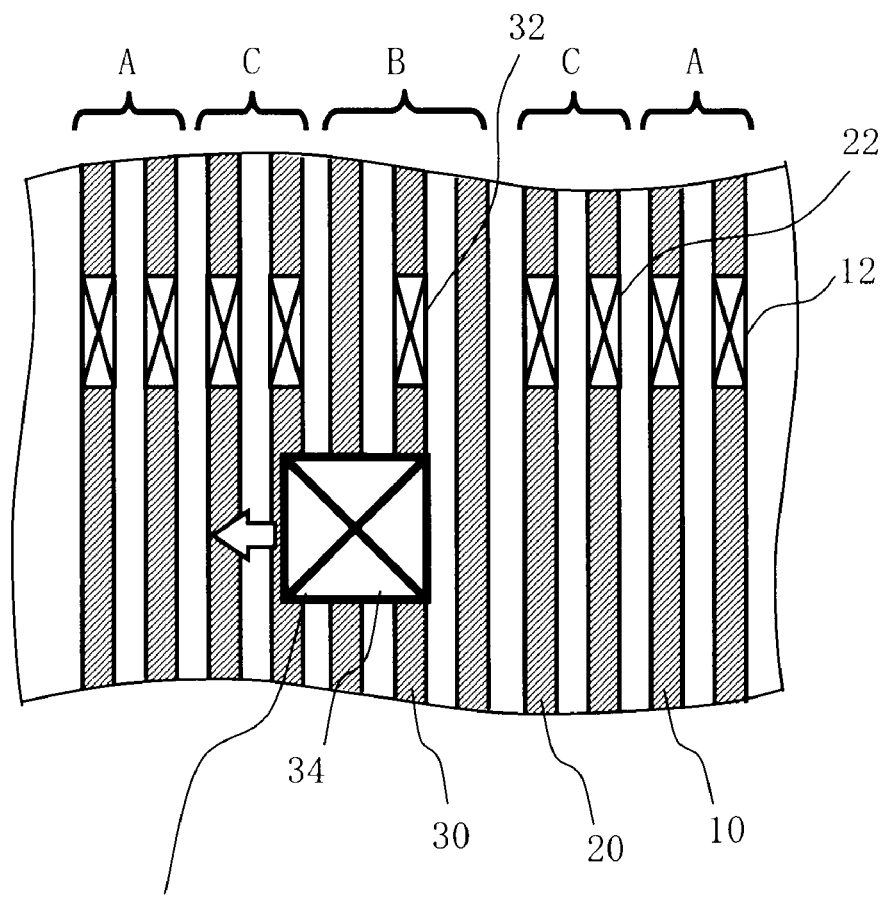
FIG. 15 is a top view when an upper-layer contact plug in the layout in FIG. 1 causes a misalignment (alignment deviation).

FIG. 15 is a top view when an upper-layer contact plug in the layout in FIG. 1 causes a misalignment. In FIG. 15, a portion of the bit lines 10 in FIG. 1 is not illustrated.

Even if the upper-layer contact plug 34 is formed with a misalignment, the dummy wires 20 are present on the side surface side of the shunt line 30. Since the dummy wires 20 are irrelevant to a memory circuit operation, a malfunction is not caused even if the upper-layer contact plug 34 comes into contact with a dummy wire. Moreover, even if the upper-layer contact plug 34 causes a misalignment, such a deviation as to disconnect all the shunt lines 30 does not usually occur. Thus, with the configuration of a semiconductor device shown in FIG. 1, even if the upper-layer contact plug 34 causes a misalignment, the upper-layer contact plug 34 can be electrically connected to at least one shunt line 30. Particularly when a semiconductor device is configured by three shunt lines 30, even if the upper-layer contact plug 34 causes a misalignment, the shunt line 30 in the center can always be connected to the upper-layer contact plug 34. Thus, the lower-layer contact plug 32 is suitably arranged so as to be connected to the shunt line 30 in the center. Therefore, a semiconductor device having an arrangement structure in FIG. 15 is also included in the embodiment 1.

Figure 16:
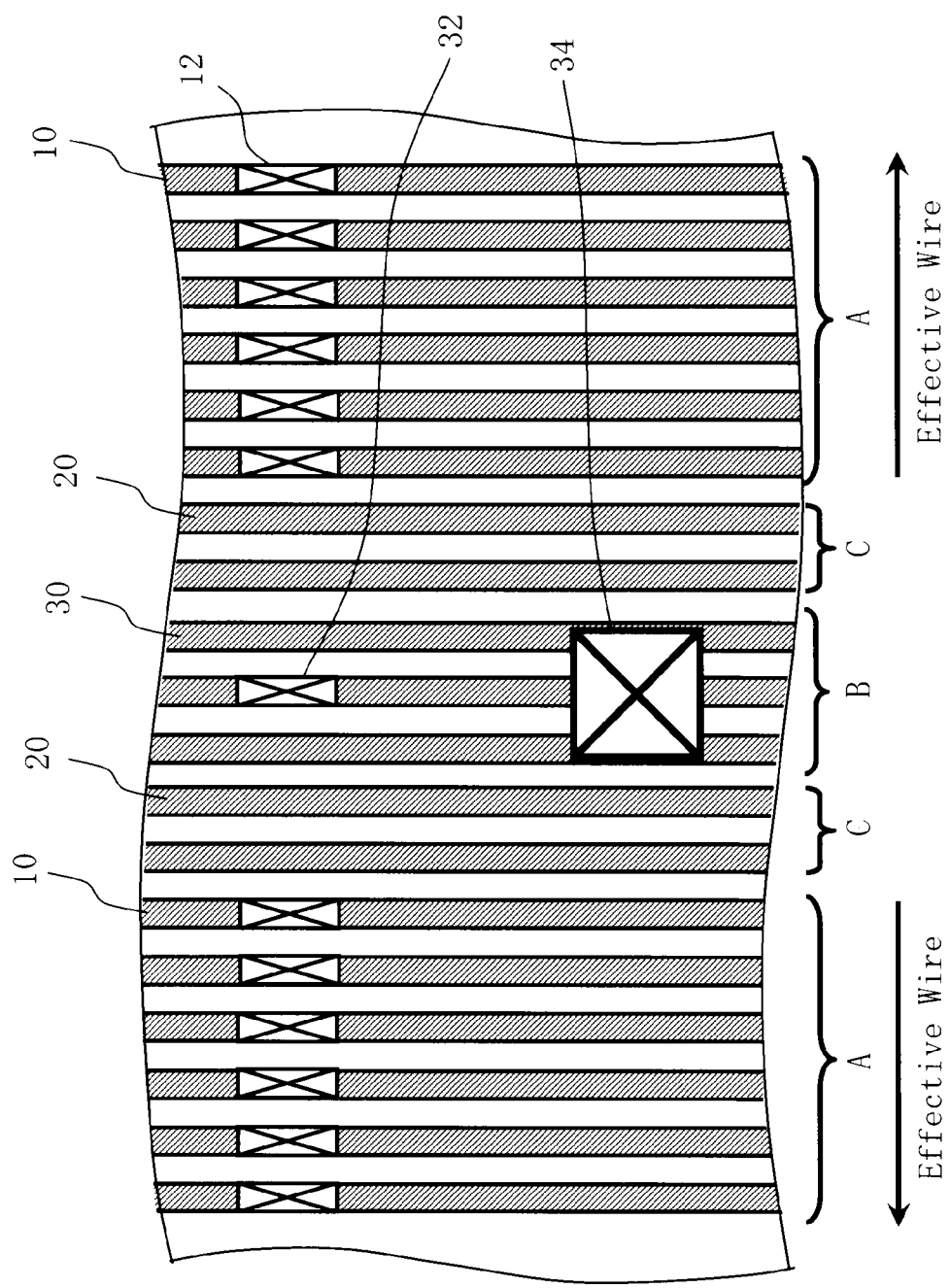
FIG. 16 is a top view showing another example of the configuration of the semiconductor device according to the embodiment 1.

Here, the lower-layer contact plug 22 is formed on the lower-layer side of the dummy wire 20 in FIG. 1, but the present embodiment is not limited to this. FIG. 16 is a top view showing another example of the configuration of the semiconductor device according to the embodiment 1. FIG. 16 is the same as FIG. 1 except that a lower-layer contact plug for dummy wire is omitted (not formed). In other words, the lower-layer contact plug 32 for the shunt line 30 is adjacent to one of a plurality of lower-layer contact plugs 12 for the bit line 10 with at least a gap of the region in which a plurality of dummy wires 20 is arranged. While, compared with the configuration in FIG. 1, lithographic resolution becomes lower when lower-layer contact plugs are formed, as shown in FIG. 16, a lower-layer contact plug for dummy wire need not be formed.

Figure 17:
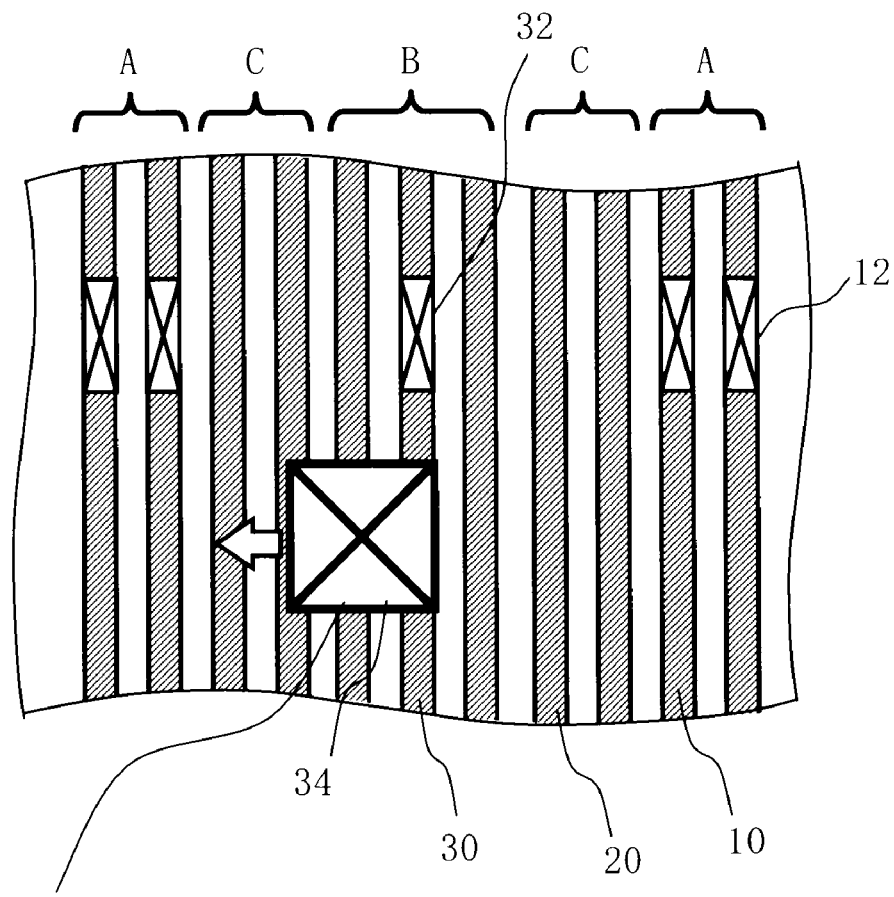
FIG. 17 is a top view when the upper-layer contact plug in the layout in FIG. 16 causes a misalignment.

FIG. 17 is a top view when the upper-layer contact plug in the layout in FIG. 16 causes a misalignment. In FIG. 17, a portion of the bit lines 10 in FIG. 16 is not illustrated.

Even if the upper-layer contact plug 34 is formed with a misalignment, like FIG. 1, the dummy wires 20 are present on the side surface side of the shunt line 30 and, like the configuration shown in FIG. 1, connection between the contact plug 34 and the shunt line 30 can be obtained.

According to the embodiment 1, as described above, lithographic resolution and optical contrast can be improved when the bit lines 10 and the shunt lines 30 are formed in the same layer. As a result, a conventionally needed space between the bit lines and shunt lines can be eliminated. Further, even if dummy wires are needed, the number thereof can be reduced.

Therefore, the chip area can be significantly reduced. Further, the barrier metal film 244 can be formed without the film running out.

Embodiment 2

In the embodiment 1, the lower-layer contact plug 32 connected to the shunt line 30 is described by taking an example in which the lower-layer contact plug 32 is formed in the same size as that of the lower-layer contact plug 12 connected to the bit lines 10. However, the present invention is not limited to this. In the embodiment 2, a configuration in which the size of the lower-layer contact plug 32 is changed will be described.

Figure 18:
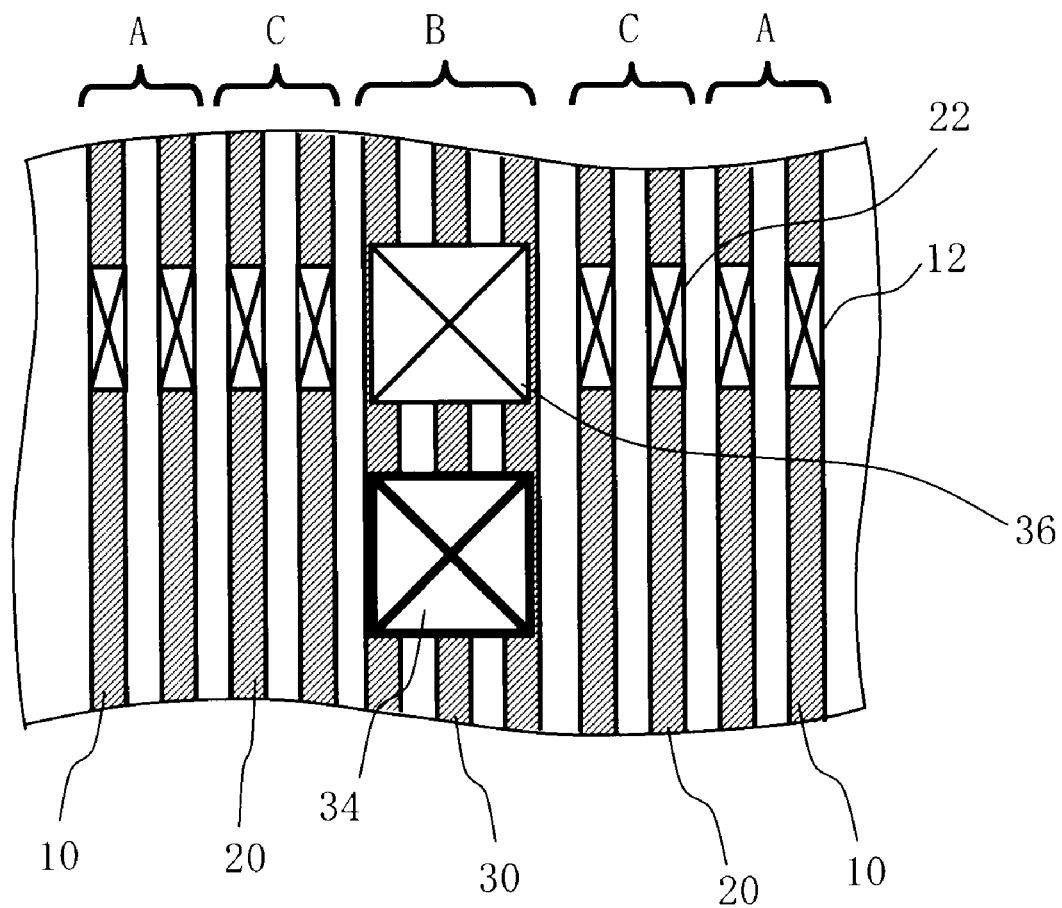
FIG. 18 is a top view showing an example of the configuration of the semiconductor device according to an embodiment 2.

FIG. 18 is a top view showing an example of the configuration of the semiconductor device according to the embodiment 2. FIG. 18 is the same as the FIG. 1 except that, instead of the lower-layer contact plug 32, a lower-layer contact plug 36 with a changed size is arranged. In FIG. 18, a portion of the bit lines 10 in FIG. 1 is not illustrated. In FIG. 18, the lower-layer contact plug 36 is formed with a size extending over a plurality of shunt lines 30. Accordingly, a contact area increases so that contact resistance can be reduced. Moreover, the size of the lower-layer contact plug 36 becomes larger than that of the lower-layer contact plug 32 in FIG. 1 so that an alignment margin can be improved for an increase in size. The method for fabricating a semiconductor device is the same as that in the embodiment 1 except that, instead of the lower-layer contact plug 32, a lower-layer contact plug 36 with a changed size is arranged. That is, the method for fabricating a semiconductor device is the same as that in the embodiment 1 except that the size of lower-layer contact holes is changed. If, for example, the lithographic process is divided into a process for forming the opening 150 to be a contact hole for the bit line 10 or the dummy wire 20 and that for forming the opening 152 to be a contact hole for the shunt line 30, high-precision openings can be formed. Naturally, the openings 150 and 152 may be formed simultaneously.

Figure 19:
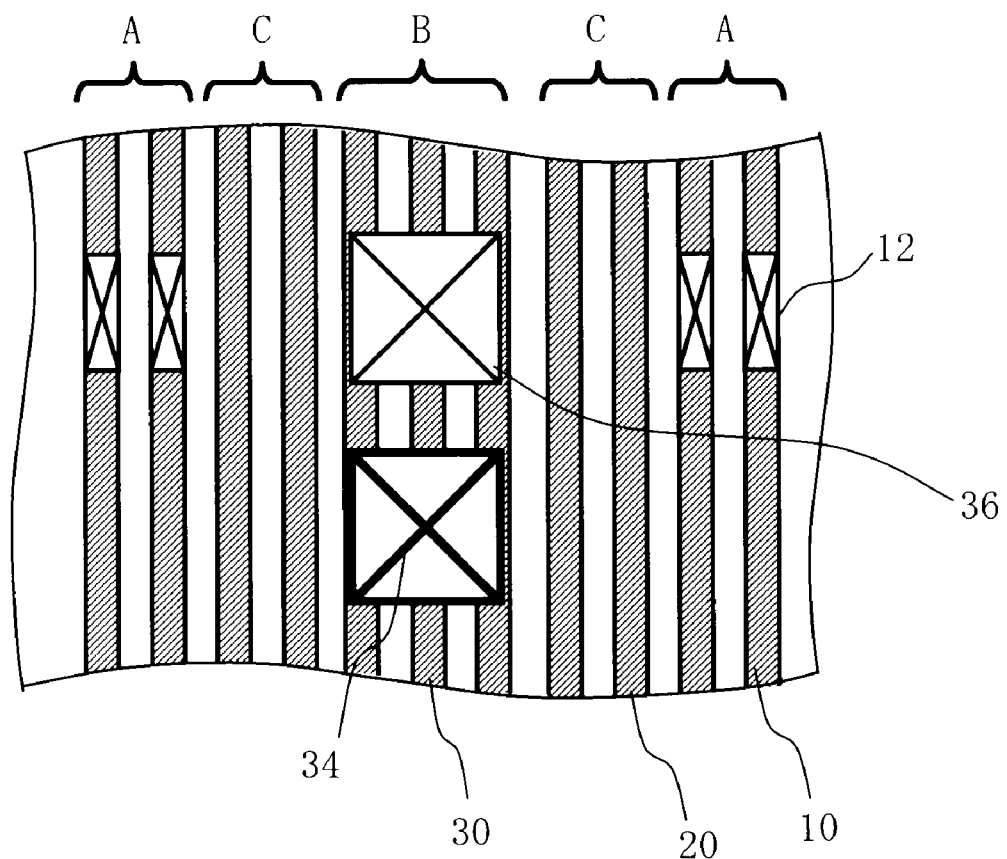
FIG. 19 is a top view showing another example of the configuration of the semiconductor device according to the embodiment 2.

Here, the lower-layer contact plug 22 is formed on the lower-layer side of the dummy wire 20 in FIG. 18, but the present embodiment is not limited to this. FIG. 19 is a top view showing another example of the configuration of the semiconductor device according to the embodiment 2. FIG. 19 is the same as FIG. 18 except that a lower-layer contact plug for dummy wire is omitted. As shown in FIG. 19, a lower-layer contact plug for dummy wire need not be formed. When the openings 150 and 152 are formed simultaneously, no hole for the lower-layer contact plug 22 is formed nearby and, if an auxiliary pattern is formed on a mask in that region, lithographic resolution of the opening 152 may improve. Thus, when the openings 150 and 152 are formed simultaneously, the configuration in FIG. 19 is particularly effective.

Figure 20:
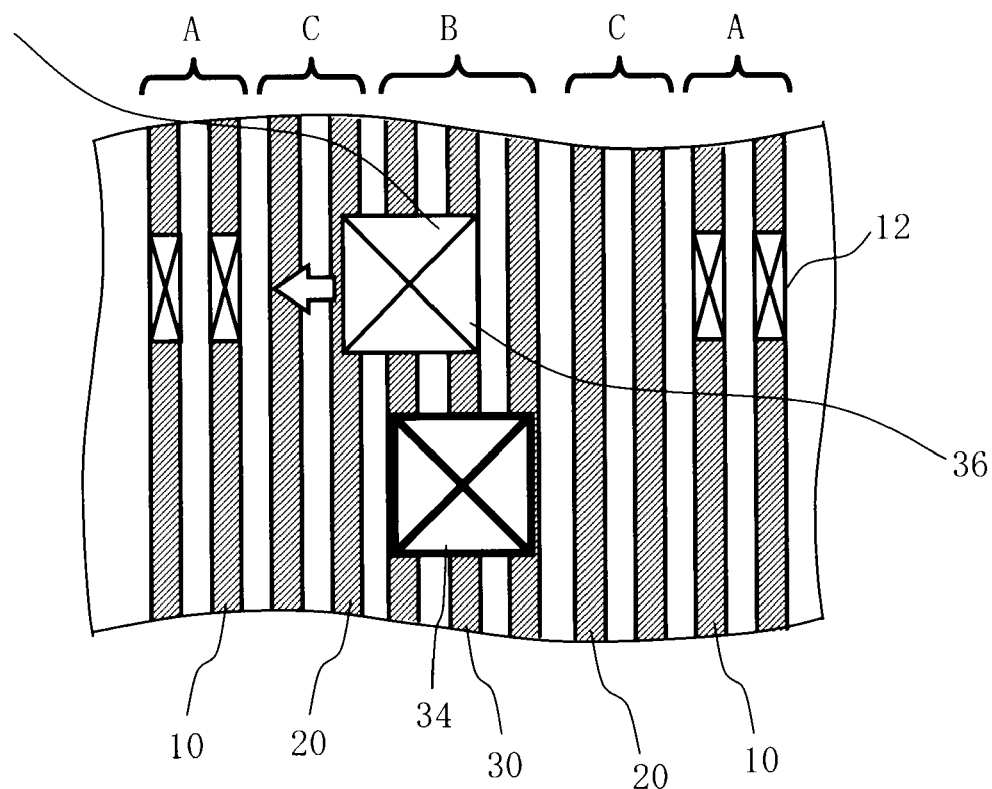
FIG. 20 is a top view when a lower-layer contact plug in the layout in FIG. 19 causes a misalignment.

FIG. 20 is a top view when a lower-layer contact plug in the layout in FIG. 19 causes a misalignment. If the lithographic process is divided into a process for forming the opening 150 and that for forming the opening 152, the lower-layer contact plug 36 may cause a misalignment. However, even if the lower-layer contact plug 36 is formed with a misalignment, the dummy wires 20 are present on the side surface side of the shunt line 30. Since the dummy wires 20 are irrelevant to a memory circuit operation, a malfunction is not caused even if the lower-layer contact plug 36 comes into contact with a dummy wire. Moreover, even if the lower-layer contact plug 36 causes a misalignment, such a deviation as to disconnect all the shunt lines 30 does not usually occur. Thus, with the configuration of a semiconductor device shown in FIG. 19, even if the lower-layer contact plug 36 causes a misalignment, the lower-layer contact plug 36 can be electrically connected to at least one shunt line 30. Particularly when a semiconductor device is configured by three shunt lines 30, even if the lower-layer contact plug 36 causes a misalignment, the shunt line 30 in the center can always be connected to the lower-layer contact plug 36.

Even if the size of a lower-layer contact plug is changed, as described above, an effect similar to that in the embodiment 1 can be achieved. Further, contact resistance can be reduced to improve an alignment margin by increasing the size of the lower-layer contact plug for the shunt line 30.

Embodiment 3

The lower-layer contact plug 32 is only connected to one of the shunt lines 30 in the embodiment 1, but the present invention is not limited to this. In the embodiment 3, a configuration in which the lower-layer contact plug 32 is arranged for each of the shunt lines 30 will be described.

Figure 21:
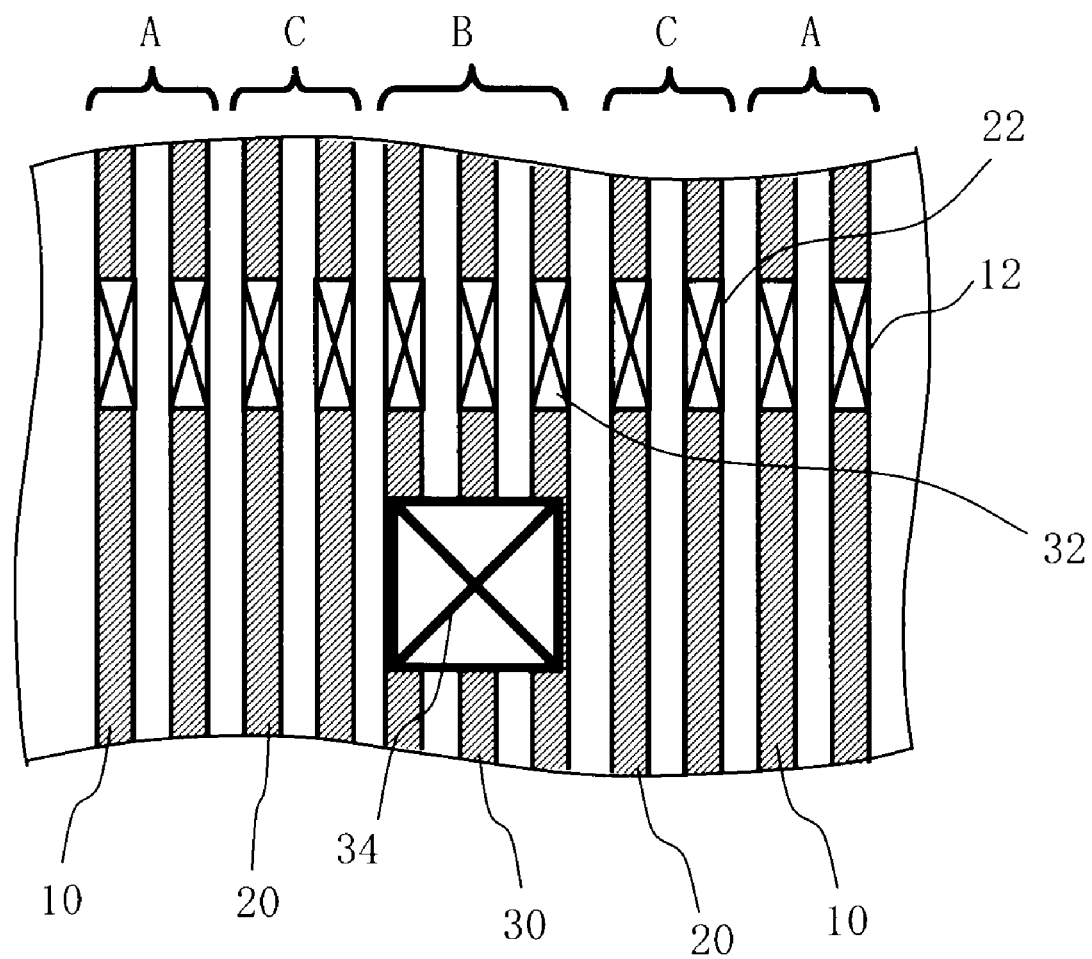
FIG. 21 is a top view showing an example of the configuration of the semiconductor device according to an embodiment 3.

FIG. 21 is a top view showing an example of the configuration of the semiconductor device according to the embodiment 3. FIG. 21 is the same as FIG. 1 except that one lower-layer contact plug 32 is arranged for each of the shunt lines 30. In FIG. 21, a portion of the bit lines 10 in FIG. 1 is not illustrated. A contact area is thereby increased so that contact resistance can be reduced. Moreover, the number of the lower-layer contact plugs 32 increases and even when the upper-layer contact plug 34 and one or two of a plurality of the shunt lines 30 are connected, the shunt lines can be caused to function as shunt lines. The method for fabricating a semiconductor device is the same as that in the embodiment 1 except that one lower-layer contact plug 32 is arranged side by side for each of the shunt lines 30. In FIG. 21, the lower-layer contact plug 32 is arranged in the same position of the all the shunt lines 30 regarding the direction in which wires extend. Accordingly, the lower-layer contact plugs 22 for dummy wire and the lower-layer contact plugs 32 for the shunt lines 30 will be arranged in the same position regarding the direction in which wires extend with the same pitch following the lower-layer contact plugs 12 for the bit lines 10, making pattern periodicity more constant than that of the configuration in FIG. 1. Therefore, lithographic resolution and optical contrast can be improved.

Thus, if the lower-layer contact plug 32 is arranged in the same position regarding the direction in which wires extend for all the shunt lines 30, an effect similar to that in the embodiment 1 can be achieved. Further, by arranging the lower-layer contact plug 32 in the same position regarding the direction in which wires extend for all the shunt lines 30, contact resistance is lowered so that a connection of the upper-layer contact plug 34 with the lower-layer contact plug 32 can reliably be established.

Embodiment 4

In the embodiment 3, the lower-layer contact plugs 12 for the bit lines 10, the lower-layer contact plugs 22 for the dummy wires 20, and the lower-layer contact plugs 32 for the shunt lines 30 are arranged in the same position regarding the direction in which wires extend, but the present invention is not limited to this. In the embodiment 4, a configuration in which the arrangement position of the lower-layer contact plug for each line (wire) is changed will be described.

Figure 22:
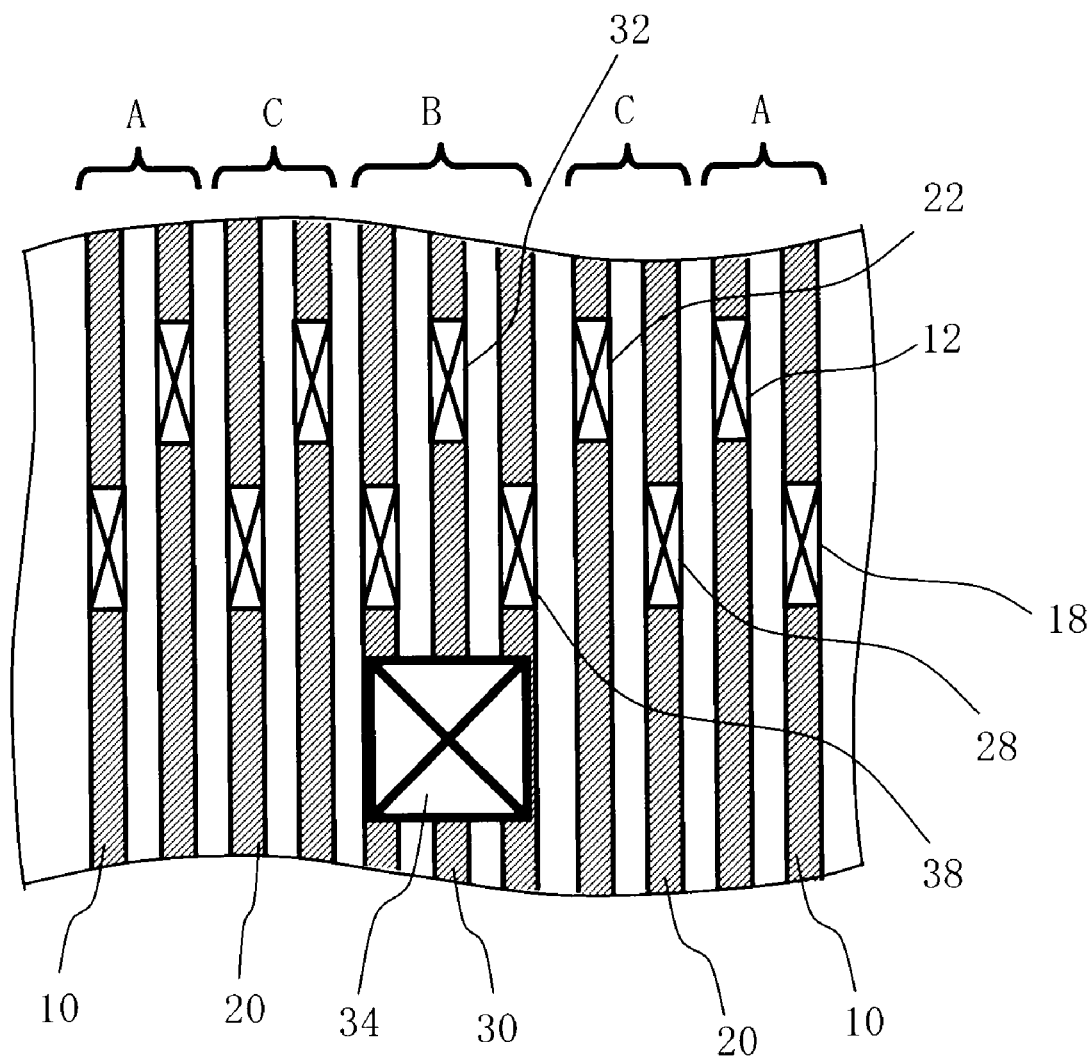
FIG. 22 is a top view showing an example of the configuration of the semiconductor device according to an embodiment 4.

FIG. 22 is a top view showing an example of the configuration of the semiconductor device according to the embodiment 4. In FIG. 22, the lower-layer contact plugs 12 for the bit lines 10 are each arranged so as to be connected to a plurality of bit lines 10 from the lower-layer side by changing the arrangement position alternately regarding the direction in which a plurality of bit lines 10 extends. Then, a plurality of lower-layer contact plugs 22 for the dummy wires 20 is each arranged so as to be connected to a plurality of dummy wires 20 from the lower-layer side by changing the arrangement position alternately to successively fit to the arrangement position alternately changed from the side of a plurality of lower-layer contact plugs 12 for the bit lines 10. Then, a plurality of lower-layer contact plugs 32 for the shunt lines 30 is each arranged so as to be connected to a plurality of shunt lines 30 from the lower-layer side by changing the arrangement position alternately to successively fit to the arrangement position alternately changed from the side of a plurality of lower-layer contact plugs 12 for the bit lines 10. Other portions of the configuration are the same as those in FIG. 21. The method for fabricating a semiconductor device is the same as that in the embodiment 1 except that the lower-layer contact plug 32 for the shunt lines 30 is arranged for all the shunt lines 30 and positions of the lower-layer contact plugs 12, 22, and 32 are alternately shifted for arrangement. With positions of the lower-layer contact plugs alternately shifted for arrangement, the distance to adjacent lower-layer contact plugs increases. Therefore, it becomes possible to form an auxiliary pattern on a mask used when a contact hole pattern is exposed to light. By forming an auxiliary pattern, lithographic resolution and optical contrast can be improved. Also with improved lithographic resolution by an auxiliary pattern being formed, a smaller contact hole can be formed. Further, with improved lithographic resolution, the risk of non-opened contact can be reduced.

Figure 23:
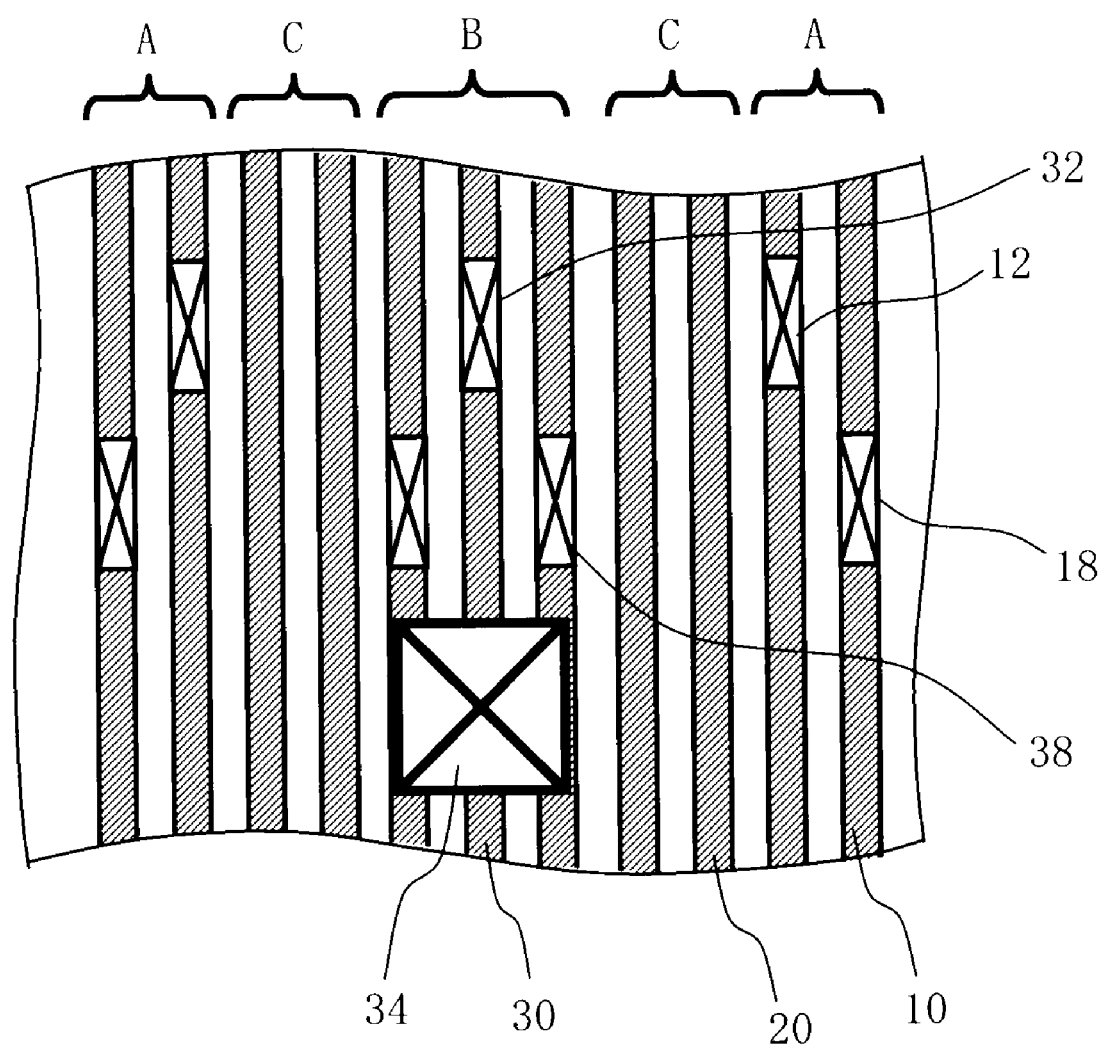
FIG. 23 is a top view showing another example of the configuration of the semiconductor device according to the embodiment 4.

Here, the lower-layer contact plug 22 is formed on the lower-layer side of the dummy wire 20 in FIG. 22, but the present embodiment is not limited to this. FIG. 23 is a top view showing another example of the configuration of the semiconductor device according to the embodiment 4. FIG. 23 is the same as FIG. 22 except that a lower-layer contact plug for dummy wire is omitted. As shown in FIG. 23, a lower-layer contact plug for dummy wire need not be formed.

Embodiment 5

Only one lower-layer contact plug 32 is connected to one of the shunt lines 30 in the embodiment 1, but the present invention is not limited to this. In the embodiment 5, a configuration in which a plurality of lower-layer contact plugs 32 is arranged for one shunt line 30 will be described.

Figure 24:
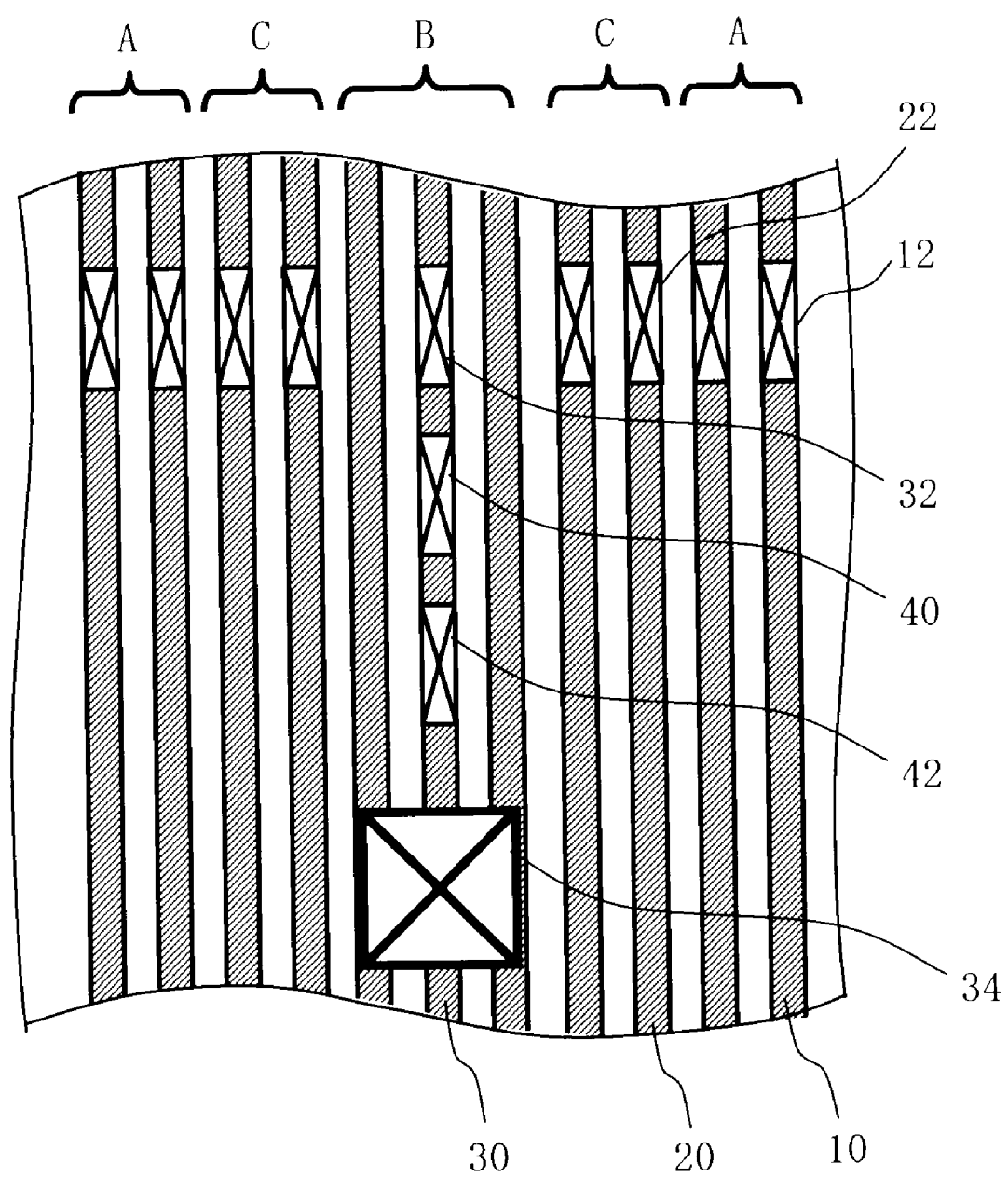
FIG. 24 is a top view showing an example of the configuration of the semiconductor device according to an embodiment 5.

FIG. 24 is a top view showing an example of the configuration of the semiconductor device according to the embodiment 5. In FIG. 24, the plurality of lower-layer contact plugs 32 for shunt line is arranged so as to be connected to at least one of a plurality shunt lines 30 from the lower-layer side. FIG. 24 shows an example in which three lower-layer contact plugs 32 are arranged side by side in the direction in which the shunt lines 30 extend. The number of the arranged lower-layer contact plugs 32 is not limited to three and any number of 2 or more is allowed. Other portions of the configuration are the same as those in FIG. 1. In FIG. 24, a portion of the bit lines 10 in FIG. 1 is not illustrated. With an increasing number of the lower-layer contact plugs 32, a contact area increases. As a result, contact resistance can be reduced. Also, with an increasing number of lower-layer contact plugs connected to shunt lines, the risk of non-opened contact can be reduced. The method for fabricating a semiconductor device is the same as that in the embodiment 1 except that the plurality of lower-layer contact plugs 32 is arranged for one shunt line 30.

Figure 25:
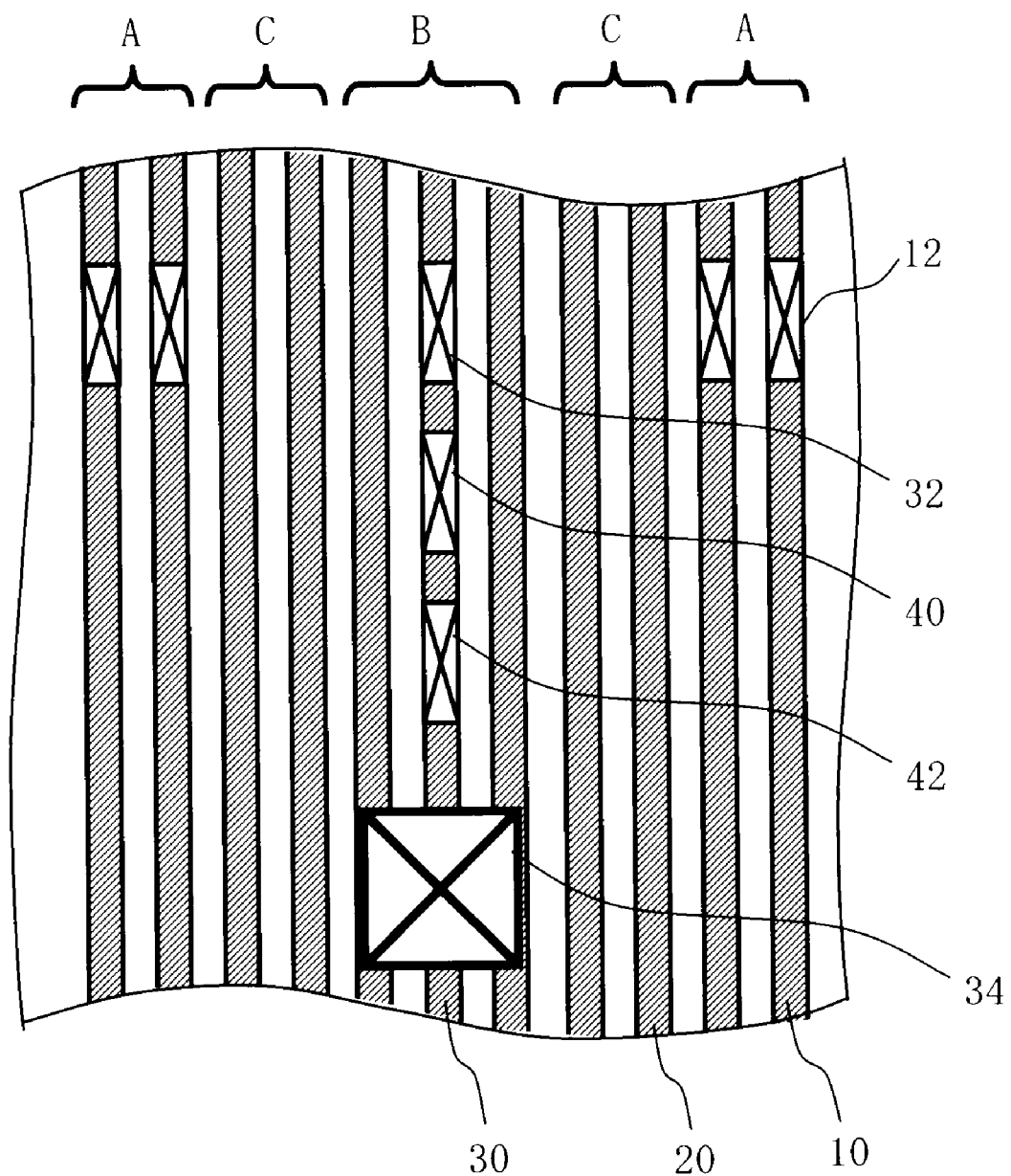
FIG. 25 is a top view showing another example of the configuration of the semiconductor device according to the embodiment 5.

Here, the lower-layer contact plug 22 is formed on the lower-layer side of the dummy wire 20 in FIG. 24, but the present embodiment is not limited to this. FIG. 25 is a top view showing another example of the configuration of the semiconductor device according to the embodiment 5. FIG. 25 is the same as FIG. 24 except that a lower-layer contact plug for dummy wire is omitted. As shown in FIG. 25, a lower-layer contact plug for dummy wire need not be formed.

In the embodiment 5, the plurality of lower-layer contact plugs 32 is arranged only for one shunt line 30, but the present embodiment is not limited to this. The plurality of lower-layer contact plugs 32 may similarly be arranged suitably for at least one of the remaining shunt lines 30. Contact resistance can be further reduced by increasing the number of the lower-layer contact plugs 32.

Also, the configuration in which the lower-layer contact plugs 12, 22, and 32 are alternately shifted for arrangement shown in the embodiment 4 and that in which the plurality of lower-layer contact plugs 32 is arranged for one shunt line 30 shown in the embodiment 5 are suitably combined. By combining these embodiments, lithographic resolution is improved and also contact resistance can be reduced. In addition, a combination with the remaining first to third embodiments is also suitable.

Figure 26:
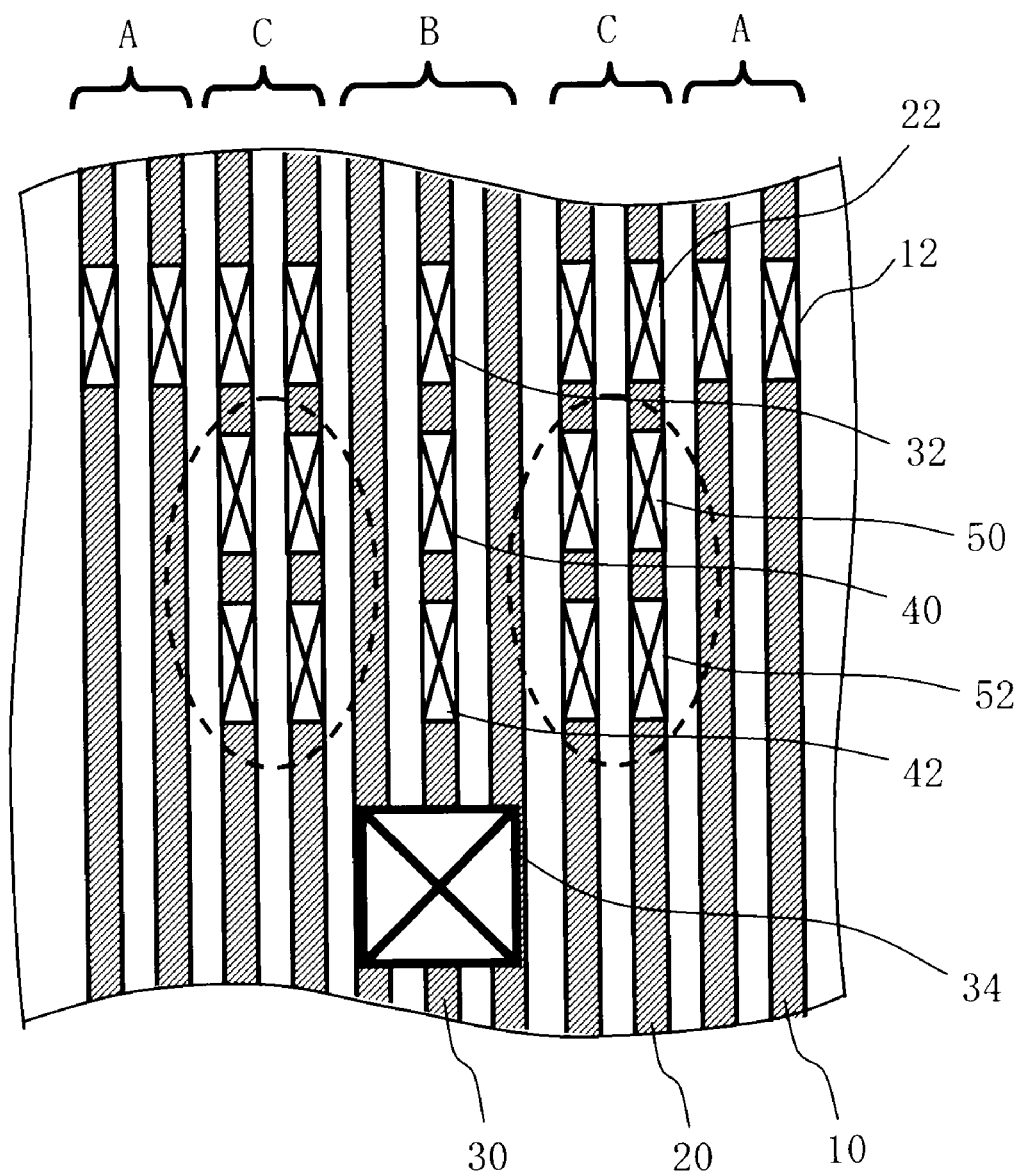
FIG. 26 is a top view showing another example of the configuration of the semiconductor device according to the embodiment 5.

FIG. 26 is a top view showing another example of the configuration of the semiconductor device according to the embodiment 5. In FIG. 26, a plurality of lower-layer contact plugs 22 is arranged also for each of the dummy wires 22 so as to be connected from the lower-layer side. FIG. 26 shows an example in which three lower-layer contact plugs 22 are arranged side by side in the direction in which the dummy wires 22 extend. Other portions of the configuration are the same as those in FIG. 24. Here, the plurality of lower-layer contact plugs 22 is arranged also for the dummy wires 20 by fitting to the arrangement positions of the plurality of lower-layer contact plugs 32 arranged for the shunt lines 30. With the configuration described above, lithographic resolution can be improved when a second or a subsequent lower-layer contact hole for the shunt line 30 shifted from the lower-layer contact plug 12 for bit line is formed. In addition, the configurations in FIG. 24 to FIG. 26 can suitably be combined with one of the first to third embodiments.

Embodiment 6

The lower-layer contact plug 32 and the upper-layer contact plug 34 are arranged away from each other in the embodiment 1, but the present invention is not limited to this. In the embodiment 6, a configuration in which both contact plugs are arranged in the same position on top of the other will be described.

Figure 27:
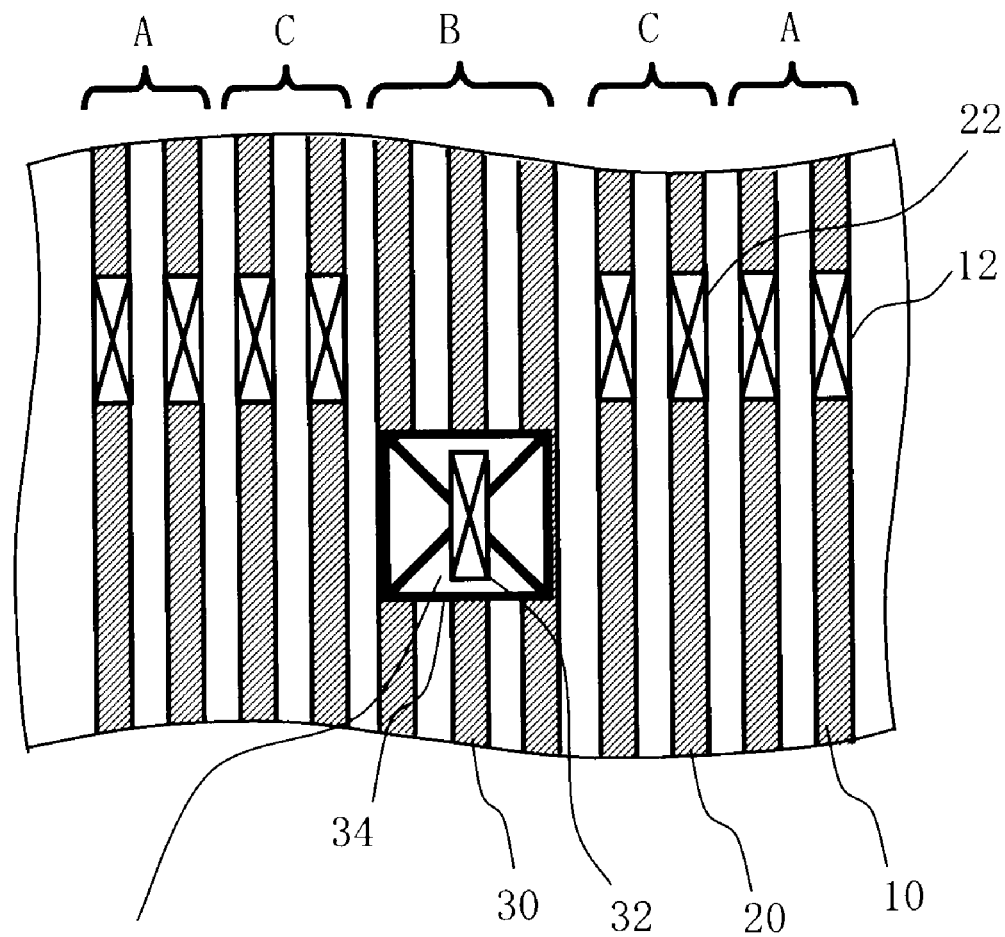
FIG. 27 is a top view showing an example of the configuration of the semiconductor device according to an embodiment 6.

FIG. 27 is a top view showing an example of the configuration of the semiconductor device according to the embodiment 6. In FIG. 27, the lower-layer contact plug 32 and the upper-layer contact plug 34 connected to the shunt line 30 are arranged at an overlapping position when viewed from above. Other portions of the configuration are the same as those in FIG. 1. In FIG. 27, a portion of the bit lines 10 in FIG. 1 is not illustrated. The method for fabricating a semiconductor device is the same as that in the embodiment 1 except that the lower-layer contact plug 32 and the upper-layer contact plug 34 are arranged at an overlapping position when viewed from above. With the lower-layer contact plug 32 and the upper-layer contact plug 34 arranged at an overlapping position when viewed from above, he lower-layer contact plug 32 and the upper-layer contact plug 34 are brought closer. Thus, the distance in which a current passes through the shunt line 30 is made shorter. Consequently, wire resistance can be reduced for a distance made shorter. Further, by applying the structure in which the lower-layer contact plug 32—the shunt line 30—the upper-layer contact plug 34 are laminated in the direction of film thickness (height direction), flexibility of design layout is improved. In FIG. 27, the lower-layer contact plug 32 overlaps with the upper-layer contact plug 34 to be included in the upper-layer contact plug 34, but the present invention is not limited to this. It is sufficient that portions thereof overlap each other. The configuration of the embodiment 6 in which the lower-layer contact plug 32—the shunt line 30—the upper-layer contact plug 34 are laminated in the direction of film thickness (height direction) may suitably be combined with each of the above embodiments.

Figure 28:
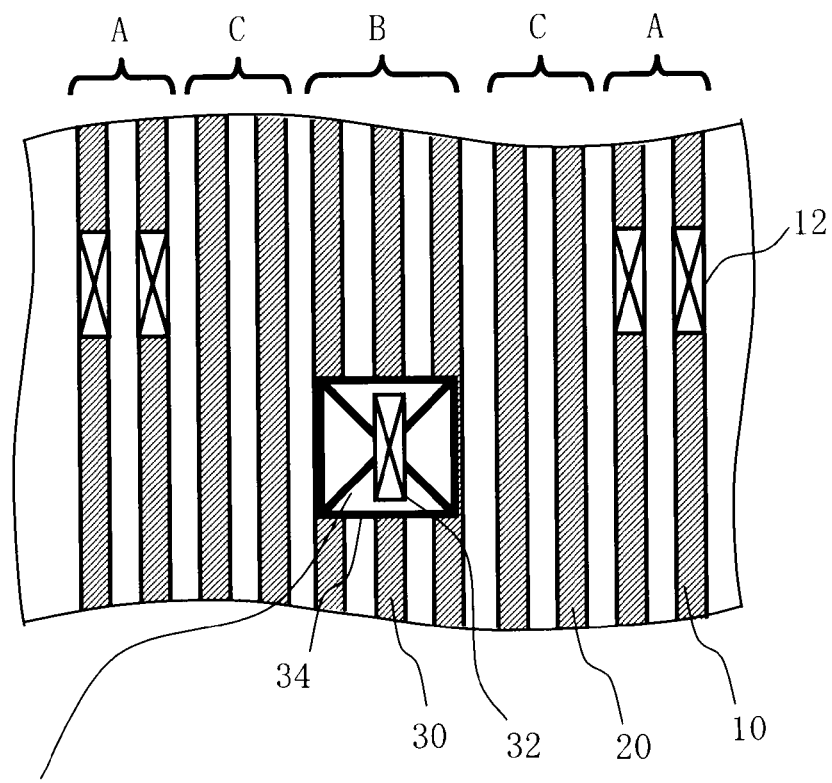
FIG. 28 is a top view showing another example of the configuration of the semiconductor device according to the embodiment 6.

Here, the lower-layer contact plug 22 is formed on the lower-layer side of the dummy wire 20 in FIG. 27, but the present embodiment is not limited to this. FIG. 28 is a top view showing another example of the configuration of the semiconductor device according to the embodiment 6. FIG. 28 is the same as FIG. 27 except that a lower-layer contact plug for dummy wire is omitted. As shown in FIG. 28, a lower-layer contact plug for dummy wire need not be formed.

Embodiment 7

In the embodiment 1, up to the etching stopper film 212 is opened when the opening 170 to be a contact hole for upper-layer contact is formed, but the present embodiment is not limited to this. Only up to some intermediate point on the inter-level dielectric film 220 may be opened.

Figure 29A:
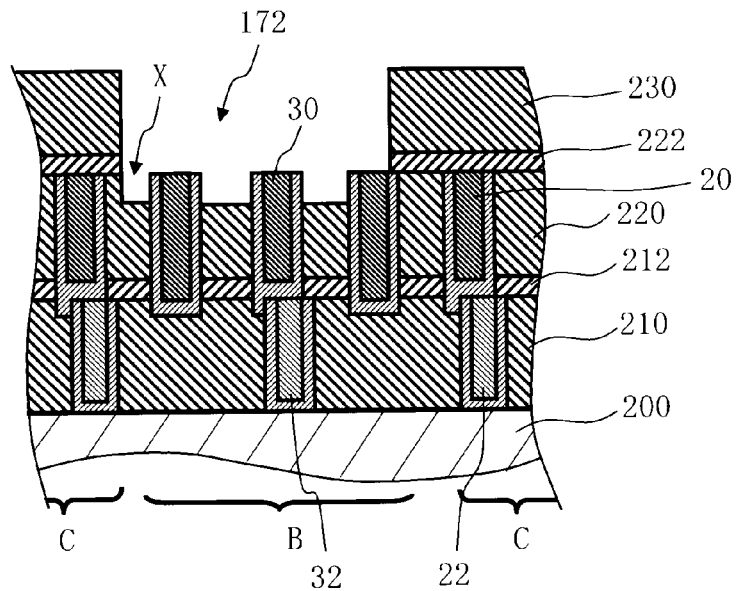
FIGS. 29A and 29B are process sectional views showing a contact hole formation process and a polishing process of an Al film when an upper-layer contact hole is formed up to a certain intermediate point on the inter-level dielectric film.
Figure 29B:
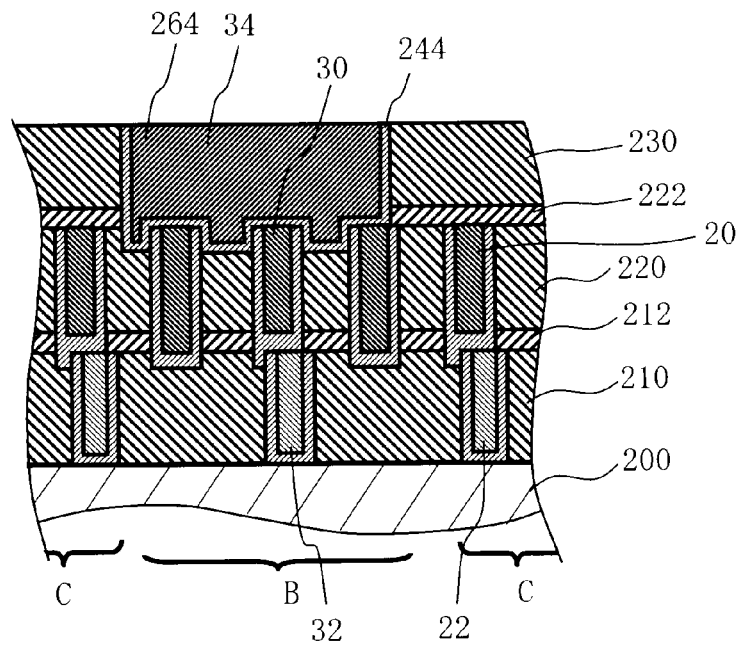

FIGS. 29A and 29B are process sectional views showing a contact hole formation process and a polishing process of an Al film when an upper-layer contact hole is formed up to a certain intermediate point on the inter-level dielectric film.

The present embodiment is the same as the embodiment 1 in that a plurality of bit lines 10 repeatedly arranged with the same line width and pitch and a plurality of shunt lines 30 arranged in parallel with the plurality of bit lines 10 and with the same line width and pitch as those of the plurality of bit lines 10 are formed in the inter-level dielectric film 220 (first dielectric film), the etching stopper film 222 is formed thereon, and the inter-level dielectric film 230 (second dielectric film) is formed thereon in a memory device region.

As shown in FIG. 29A, as the contact hole formation process (S132), an opening 172, which is a contact hole structure for connection to the plurality of shunt lines 30 in the lithography and dry etching processes, may be etched up to a certain intermediate point on the inter-level dielectric film 220. In other words, the opening 172 is formed at positions of the plurality of shunt lines 30 by cutting through the inter-level dielectric film 230 and the etching stopper film 222 and up to a certain intermediate point on the inter-level dielectric film 220. In that case, as shown in FIG. 29B, the barrier metal film 244 is ideally formed without a break on the flank and at the bottom of the Al film 264. However, a slit portion (X) on the external side of the shunt line 30 at the edge is likely to be narrower than the width between the shunt lines 30. Thus, there is a possibility that the barrier metal film 244 may not be embedded without a break. Thus, in the embodiment 7, a fabricating method to improve embedding properties of the barrier metal film 244 will be described. The configuration of a semiconductor device only needs to be like any of the above embodiments.

Figure 30:
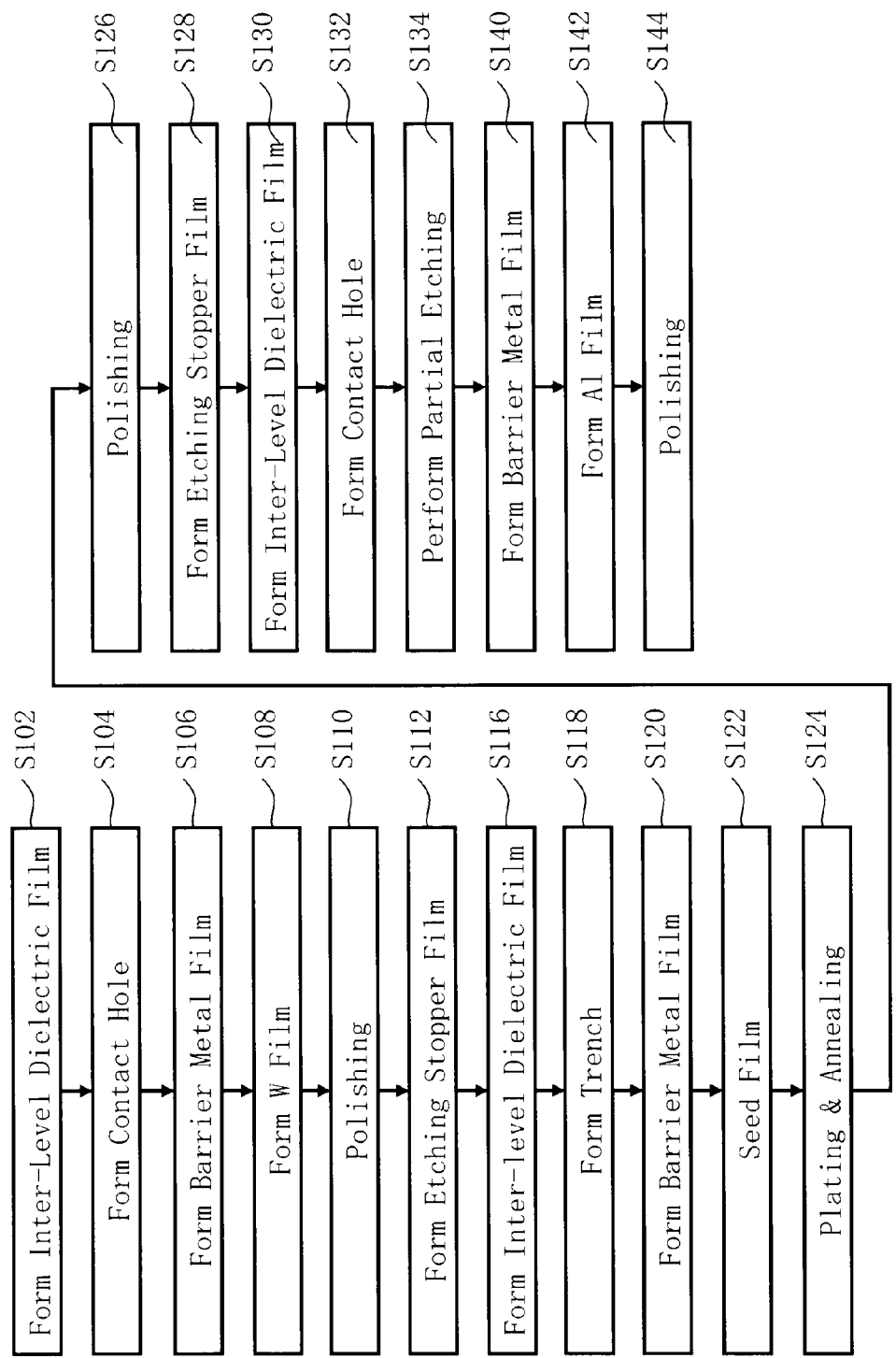
FIG. 30 is a flow chart showing principal parts of the method for fabricating a semiconductor device according to an embodiment 7.

FIG. 30 is a flow chart showing principal parts of the method for fabricating a semiconductor device according to the embodiment 7. FIG. 30 is the same as FIG. 2 except that a partial etching process (S134) is added between the contact hole formation process (S132) and the barrier metal film formation process (S140). Content of the fabricating method is the same as that in the embodiment 1 from the inter-level dielectric film formation process (S102) to the inter-level dielectric film formation process (S130). As shown in FIG. 29A, content of the contact hole formation process (S132) is to form the opening 172 by etching the inter-level dielectric film 220 up to a certain intermediate point. Thus, the partial etching process (S134) is entered from the state shown in FIG. 29A.

Figure 31A:
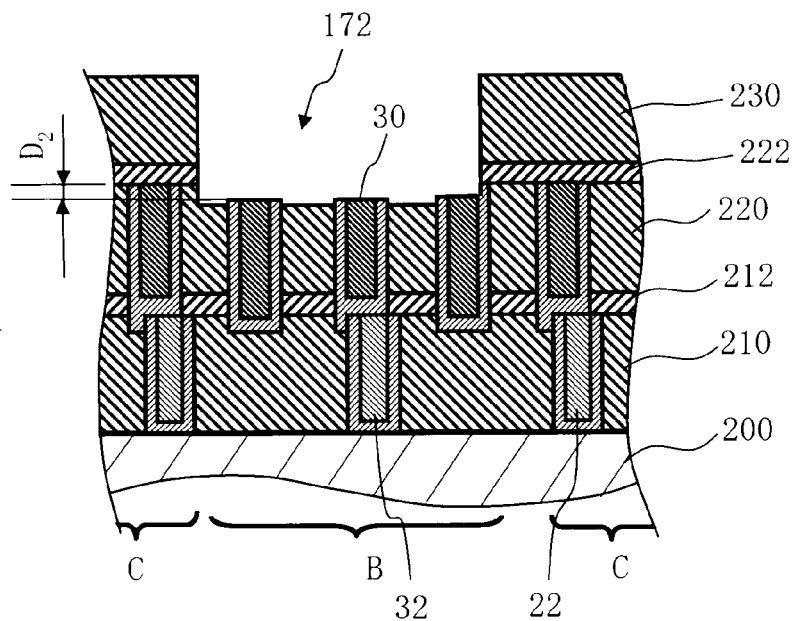
FIGS. 31A and 31B are process sectional views showing processes performed corresponding to the flow chart in FIG. 30.
Figure 31B:
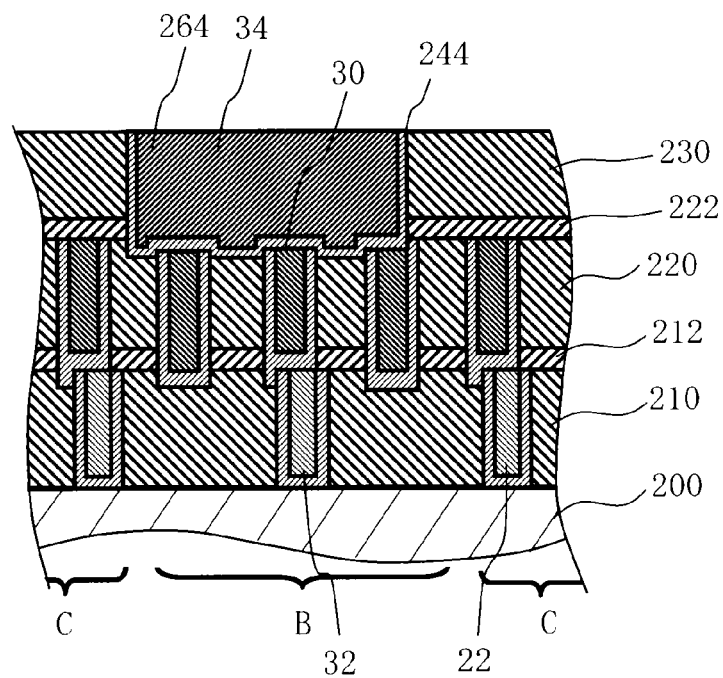

FIGS. 31A and 31B are process sectional views showing processes performed corresponding to the flow chart in FIG. 30. FIGS. 31A and 31B show the partial etching process (S134) to the polishing process (S144) in FIG. 30.

In FIG. 31A, as the partial etching process (S134), an upper part of the shunt lines 30 is etched using the wet etching method to make the shunt lines 30 lower than the bit lines 10 and the dummy wires 20. The difference thereof is denoted in FIG. 31A as D2. By etching a portion of the shunt lines 30 projecting upward from the bottom of the opening 172 in this manner, the level difference between the bottom of the opening 172 and the upper surface of the shunt lines can be made smaller. As a result, embedding properties of the barrier metal film 244 can be improved. This is particularly effective for the slit portion (X) on the external side of the shunt line 30 at the edge where embedding is difficult to perform. An aqueous solution in which organic acid and hydrogen peroxide are mixed, for example, can be used as an etchant. Then, by performing a series of processes from the barrier metal film formation process (S140) to the polishing process (S144) with the same content as that in the embodiment 1, a planarized semiconductor device as shown in FIG. 31B can be fabricated. That is, a contact material is embedded in the opening 172 as if to extend over a plurality of the shunt lines 30 made lower than a plurality of the bit lines 10 and the dummy wires 20. Here, the etching method is not limited to the wet etching method and other methods, for example, the dry etching method may also be used. The shunt line 30 has Cu as a main component for which dry etching is hard to perform, but partial etching here need not be precise in dimensions and therefore, even the dry etching method is capable of adequately etching the shunt line 30, for example, by raising the treatment temperature of dry etching. The method for partial etching is not limited to the example shown in FIG. 31A. Other methods will be described.

Figure 32A:
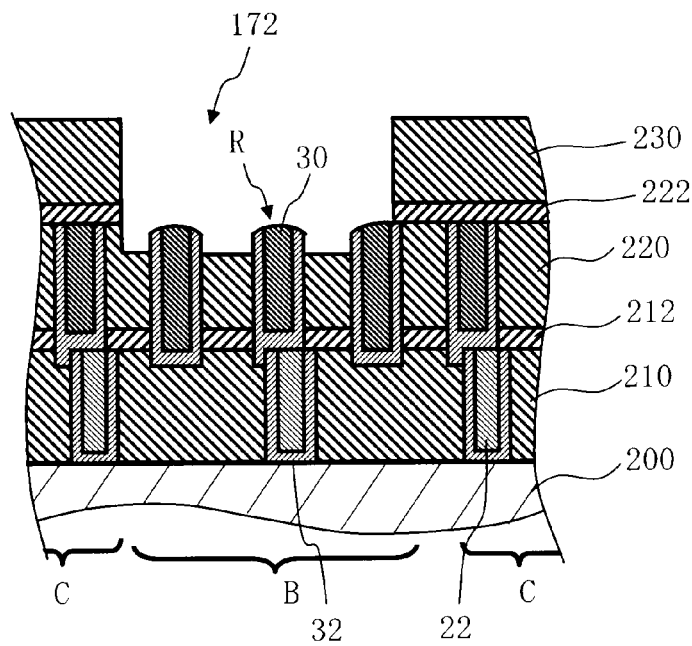
FIGS. 32A and 32B are process sectional views showing another example of processes performed corresponding to the flow chart in FIG. 30.
Figure 32B:
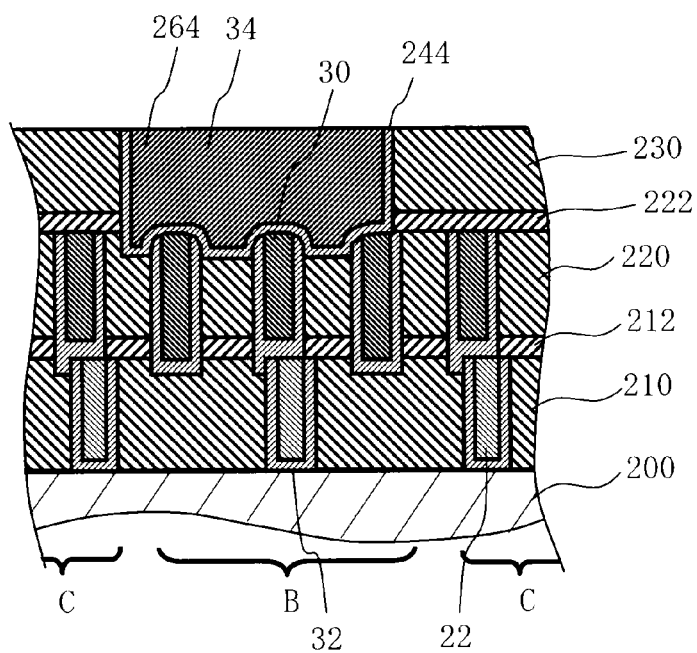

FIGS. 32A and 32B are process sectional views showing another example of processes performed corresponding to the flow chart in FIG. 30. FIGS. 32A and 32B show the partial etching process (S134) to the polishing process (S144) in FIG. 30.

In FIG. 32A, as the partial etching process (S134), corners (shoulders) in the upper part of the shunt line 30 are etched by using the wet etching method. For example, corners may be removed obliquely in a line or by forming a curve R. It is more suitable to make corners rounded off. In this manner, embedding properties of the barrier metal film 244 can be improved. This is particularly effective for the slit portion (X) on the external side of the shunt line 30 at the edge where embedding is difficult to perform. Then, by performing a series of processes from the barrier metal film formation process (S140) to the polishing process (S144) with the same content as that in the embodiment 1, a planarized semiconductor device as shown in FIG. 32B can be fabricated. Here, the etching method is not limited to the wet etching method and other methods, for example, the dry etching method may also be used.

Figure 33A:
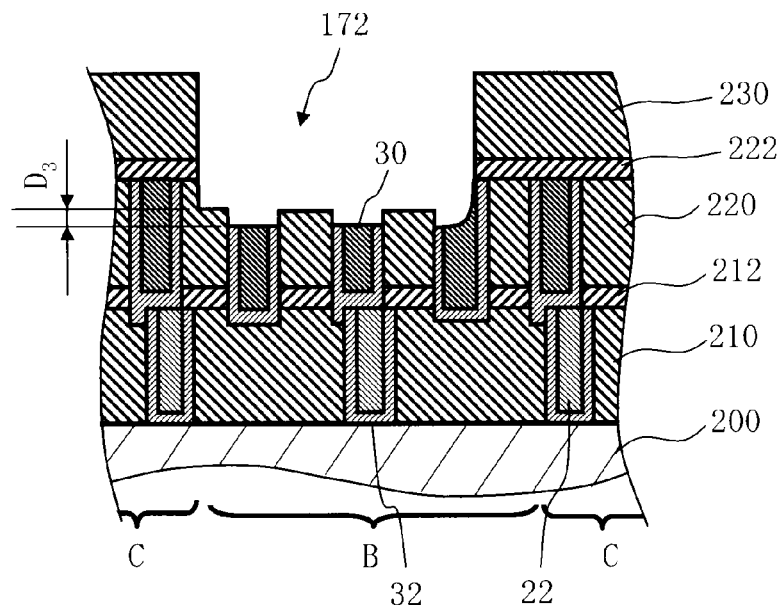
FIGS. 33A and 33B are process sectional views showing another example of processes performed corresponding to the flow chart in FIG. 30.
Figure 33B:
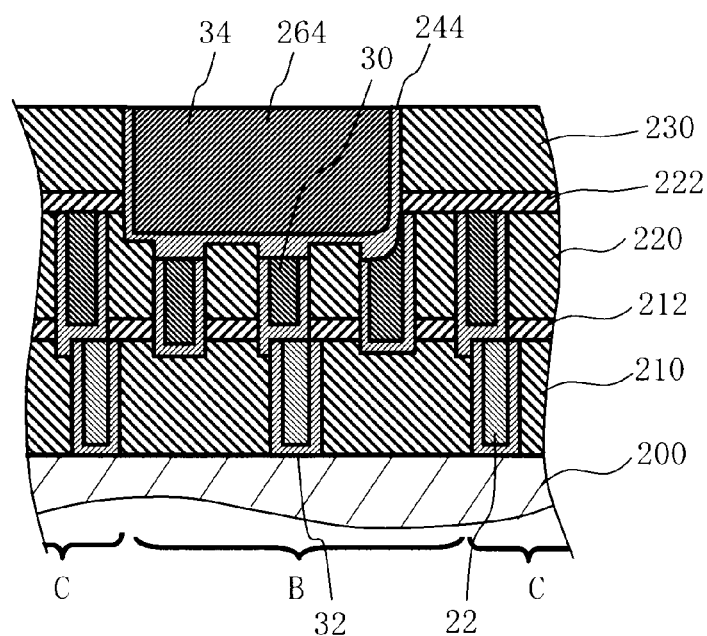

FIGS. 33A and 33B are process sectional views showing another example of processes performed corresponding to the flow chart in FIG. 30. FIGS. 33A and 33B show the partial etching process (S134) to the polishing process (S144) in FIG. 30.

In FIG. 33A, as the partial etching process (S134), the upper part of the shunt line 30 is etched by using the wet etching method to form a recess that is made lower than the bottom of the opening 172. The difference thereof is denoted in FIG. 33A as D3. Thus, by etching the shunt line 30 projecting upward from the bottom of the opening 172 until the shunt line 30 becomes lower than the bottom of the opening 172, the level difference between the bottom of the opening 172 and the upper surface of the shunt line 30 is made smaller and also the slit portion (X) on the external side of the shunt line 30 at the edge where embedding is difficult to perform can be eliminated. As a result, embedding properties of the barrier metal film 244 can be improved. Then, by performing a series of processes from the barrier metal film formation process (S140) to the polishing process (S144) with the same content as that in the embodiment 1, a planarized semiconductor device as shown in FIG. 33B can be fabricated. Here, the etching method is not limited to the wet etching method and other methods, for example, the dry etching method may also be used.

Here, an example in which etching is performed in such a way that there is a level difference between the upper surface of the shunt line 30 and the bottom of the opening 172 is described, but etching may be performed so as to make the upper surface of the shunt line 30 as high as the bottom of the opening 172.

The partial etching process (S134) described in the embodiment 7 can effectively combined even when up to the etching stopper film 212 is opened like in the embodiment 1.

Embodiment 8

In the above embodiments, examples in which the barrier metal film 244 is formed between Al to be a material of the upper-layer contact plug 34 and Cu to be a material of the shunt line 30 to avoid contact of Al and Cu are described. In the embodiment 8, a configuration that further enhances barrier properties will be described.

Figure 34:
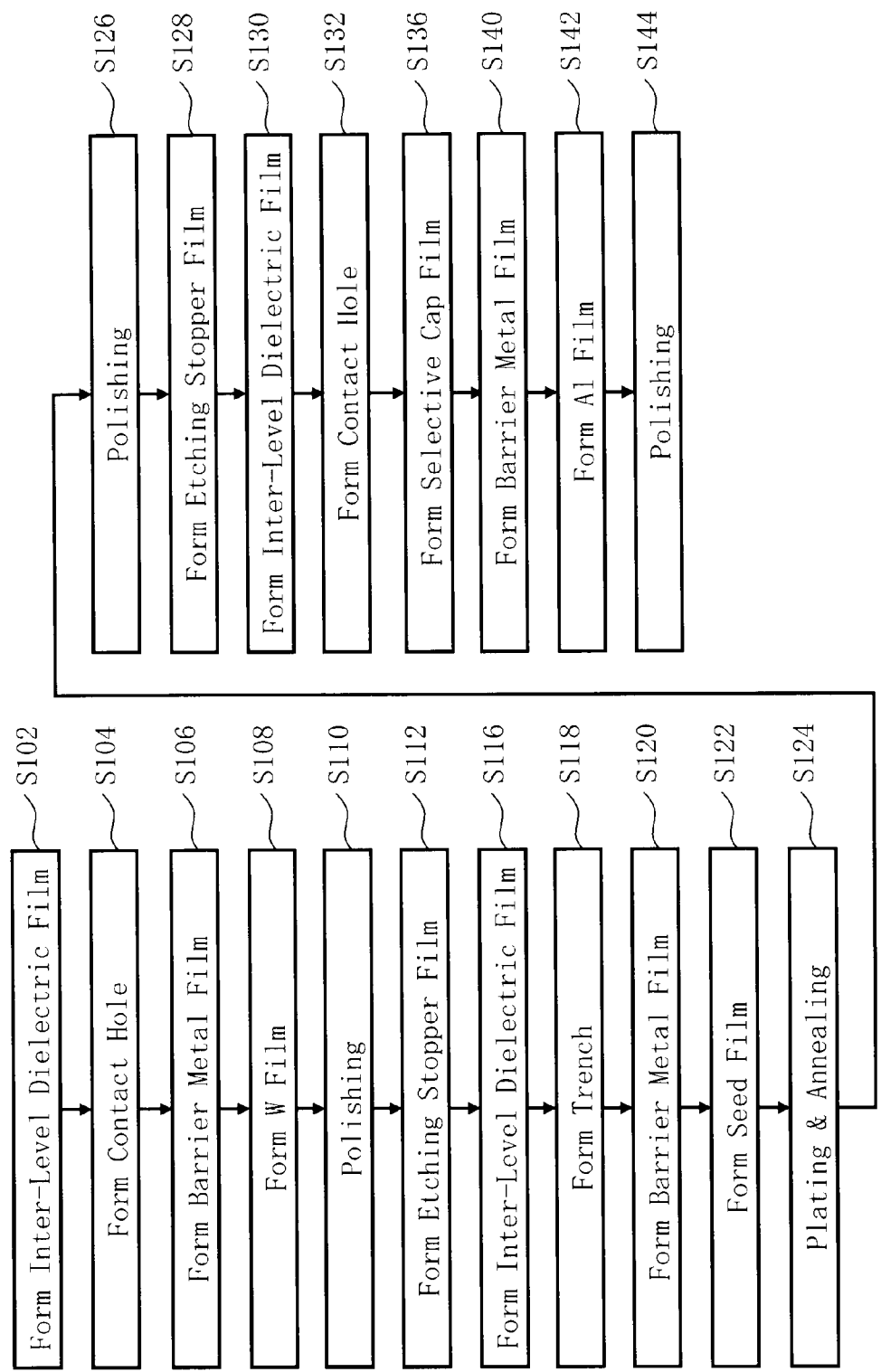
FIG. 34 is a flow chart showing principal parts of the method for fabricating a semiconductor device according to an embodiment 8.

FIG. 34 is a flow chart showing principal parts of the method for fabricating a semiconductor device according to the embodiment 8. FIG. 34 is the same as FIG. 2 except that a selective cap film formation process (S136) is added between the contact hole formation process (S132) and the barrier metal film formation process (S140). Content of the fabricating method is the same as that in the embodiment 1 from the inter-level dielectric film formation process (S102) to the inter-level dielectric film formation process (S130). As shown in FIG. 29A, content of the contact hole formation process (S132) is to form the opening 172 by etching the inter-level dielectric film 220 up to a certain intermediate point. Thus, the upper-layer contact plug 34 is arranged in such a way that a portion thereof is embedded in the inter-level dielectric film 220. Then, the selective cap film formation process (S136) is entered from the state shown in FIG. 29A.

Figure 35A:
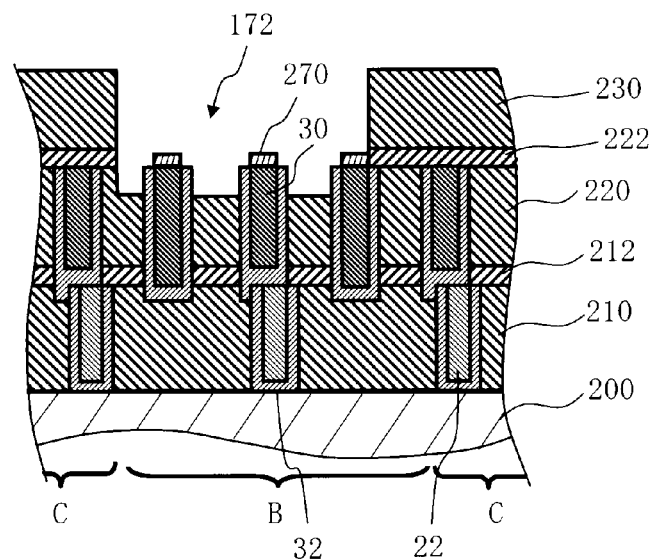
FIGS. 35A and 35B are process sectional views showing processes performed corresponding to the flow chart in FIG. 34.
Figure 35B:
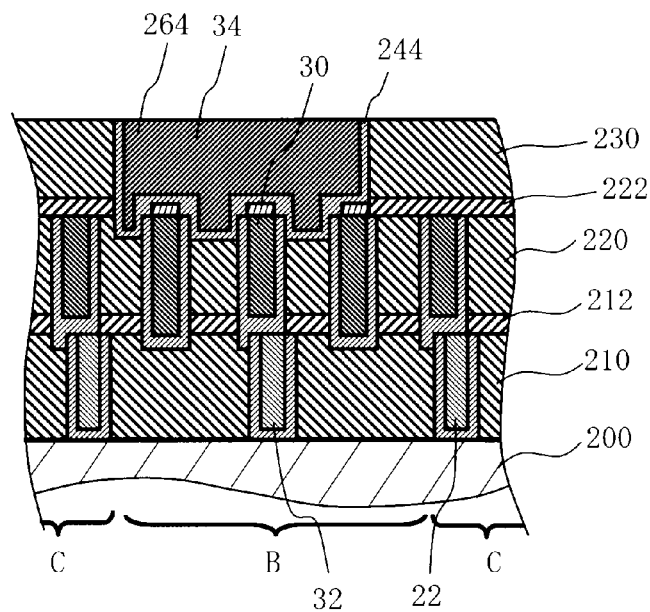

FIGS. 35A and 35B are process sectional views showing processes performed corresponding to the flow chart in FIG. 34. FIGS. 35A and 35B show the selective cap film formation process (S136) to the polishing process (S144) in FIG. 34.

In FIG. 35A, as the selective cap film formation process (S136), a selective cap film 270 is selectively formed in a portion of the shunt line 30 where Cu is exposed. Cu is mainly exposed on the upper surface of the shunt line 30. Due to etching processes to open the upper-layer contact 172, the barrier metal film 242 on the side of the shunt line 30 is also etched so that there may be partially a discontinuity of the barrier metal film 242. Thanks to film formation processes of the selective cap film, a selective cap is complementarily formed in such locations where barrier metal is discontinuous on the side of wire. For example, a CuSiN film, which is a compound film of Cu, silicon (Si), and nitrogen (N), is suitably formed as the selective cap film 270. A CuSiN film is formed as described below. A CuSiN film can be formed by selective reforming treatment of the surface of the Cu film 262 by supplying a silane ($SiH_4$) gas and an ammonium ($NH_3$) gas into a reaction vessel in which the substrate 200 is arranged. More specifically, after a Cu wire is formed, an oxide film on the surface of the Cu film 262 is removed by reducing plasma and then, the surface of the Cu film 262 is exposed to an $SiH_4$ gas to diffuse Si into Cu. Subsequently, excessive Si is removed by plasma containing N, which is a component of the $NH_3$ gas, to form Si—N bonds on the surface of the Cu film 262. The Cu film 262 is formed to a thickness of, for example, 5 nm. With the CuSiN film being formed, Cu diffusion into the dielectric film can be suppressed. Or, a Co alloy film, for example, can also be suitably formed, as described below, as the selective cap film 270. A Co alloy film exposing a Co alloy is formed on the surface a Cu wire using electroless plating. Cobalt tungsten boron (CoWB), for example, is suitable as a Co alloy. More specifically, after a Cu wire being formed, an oxide film on the surface of the Cu film 262 is removed by a wet process in which the Cu wire is soaked in a chemical solution such as hydrochloric acid (HCl) and fluoric acid (HF) and then, CoWB is formed on the surface of the Cu film 262 by electroless plating using dimethyl amine boranes (DMAB). In addition to CoWB, cobalt tungsten phosphorus (CoWP) or a Co alloy containing CoWP is suitable as the material of a Co alloy film. Or, for example, a metal film such as W, Ru, and Co may be formed by the selective CVD method as the selective cap film 270.

By forming the selective cap film 270, a fine wire structure of Cu is completely enclosed by the selective cap film 270 so that the structure of Cu is greatly stabilized. This structure is effective particularly when Cu is used for fine wires and elements other than Cu for the upper-layer contact. If, for example, Al is used for the upper-layer contact plug 34, Cu and Al form a system that has mutually a solubility limit and further creates compounds and therefore, it is necessary to insert a complete barrier metal layer between Cu and Al. The selective cap film 270 has itself excellent barrier properties and is also superior in coating properties and continuity to formation of the barrier metal film 244 and therefore, reliability between fine wires and the upper-layer contact plug is further improved.

Then, by performing a series of processes from the barrier metal film formation process (S140) to the polishing process (S144) with the same content as that in the embodiment 1, a planarized semiconductor device as shown in FIG. 35B can be fabricated.

Embodiment 9

In the embodiment 9, a configuration in which barrier properties are further enhanced by combining the embodiment 7 and the embodiment 8 will be described.

Figure 36:
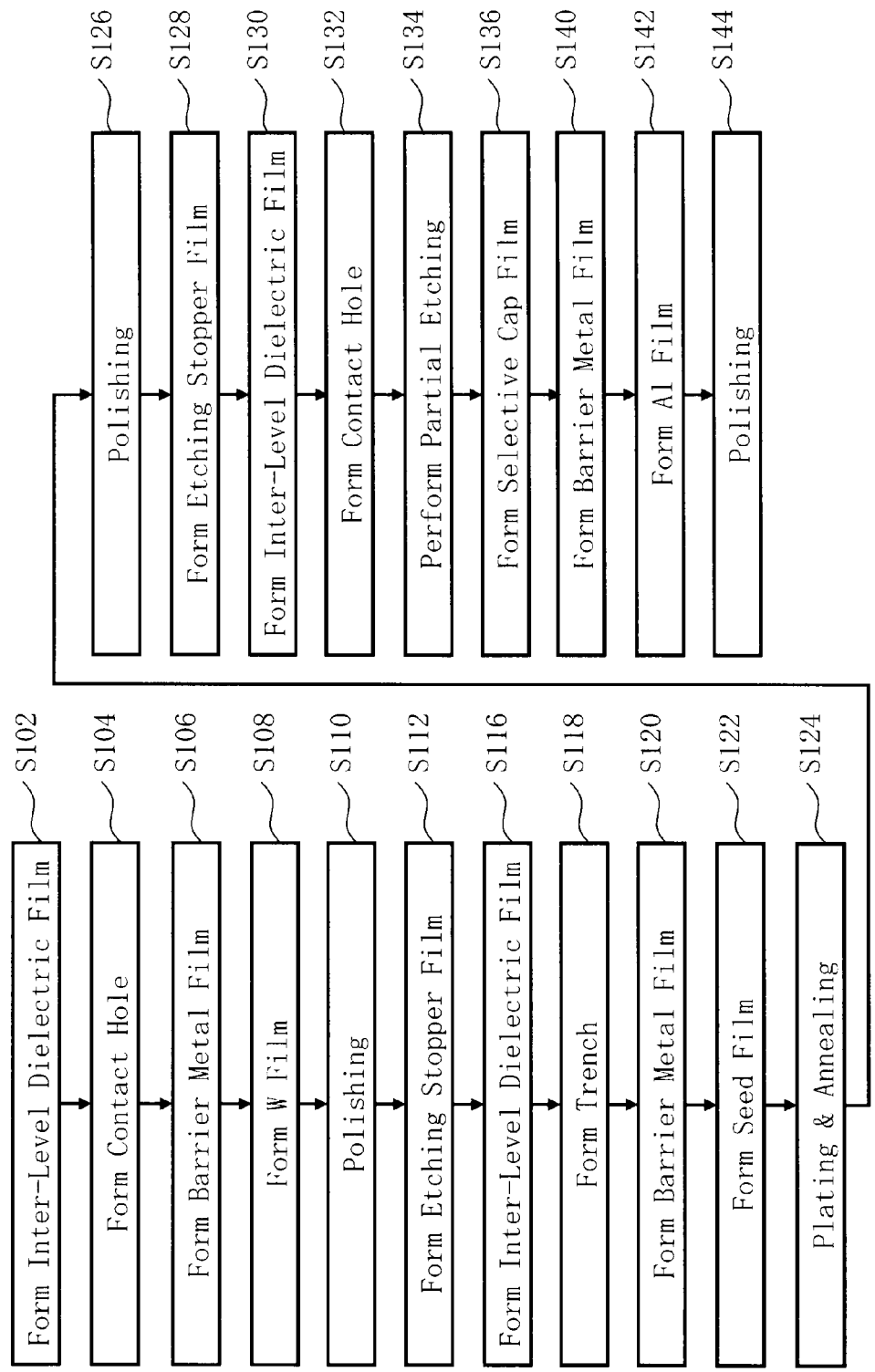
FIG. 36 is a flow chart showing principal parts of the method for fabricating a semiconductor device according to an embodiment 9.

FIG. 36 is a flow chart showing principal parts of the method for fabricating a semiconductor device according to the embodiment 9. FIG. 36 is the same as FIG. 2 except that partial etching process (S134) and the selective cap film formation process (S136) are added between the contact hole formation process (S132) and the barrier metal film formation process (S140). Content of the fabricating method is the same as that in the embodiment 1 from the inter-level dielectric film formation process (S102) to the inter-level dielectric film formation process (S130). As shown in FIG. 29A, content of the contact hole formation process (S132) is to form the opening 172 by etching the inter-level dielectric film 220 up to a certain intermediate point. Thus, the upper-layer contact plug 34 is arranged in such a way that a portion thereof is embedded in the inter-level dielectric film 220. Then, as shown in FIG. 33A, content of the partial etching process (S134) is to etch the upper part of the shunt line 30 to make the shunt line 30 lower than the bottom of the opening 172. Thus, the selective cap film formation process (S136) is entered from the state shown in FIG. 33A.

Figure 37A:
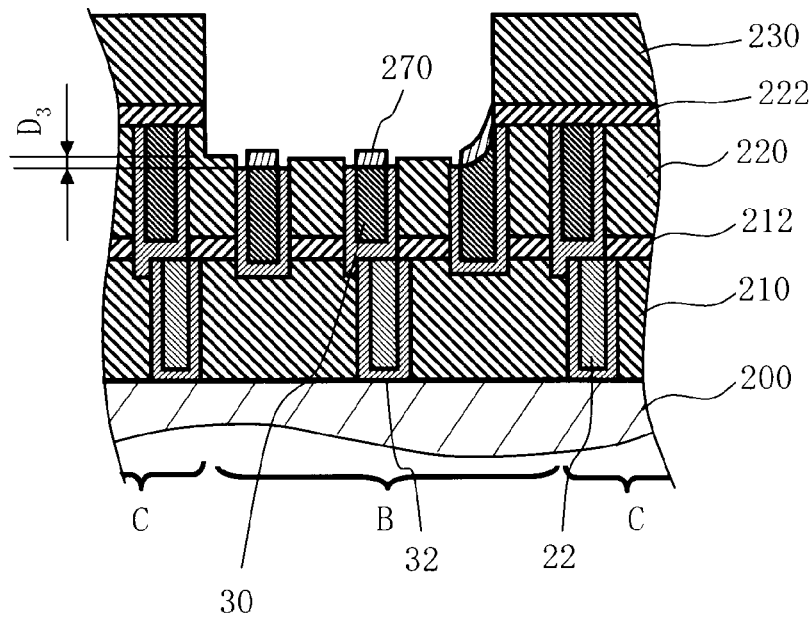
FIGS. 37A and 37B are process sectional views showing processes performed corresponding to the flow chart in FIG. 36.
Figure 37B:
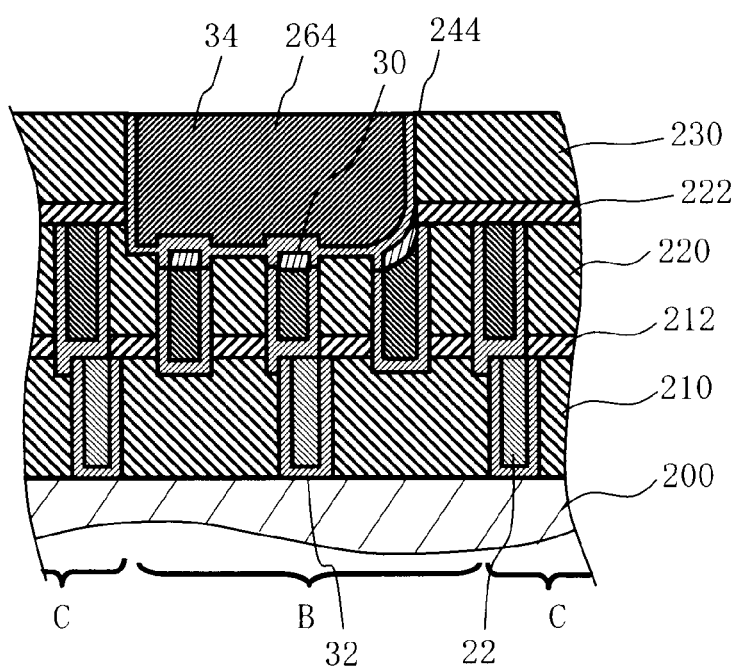

FIGS. 37A and 37B are process sectional views showing processes performed corresponding to the flow chart in FIG. 36. FIGS. 37A and 37B show the selective cap film formation process (S136) to the polishing process (S144) in FIG. 36.

In FIG. 37A, as the selective cap film formation process (S136), the selective cap film 270 is selectively formed in a portion of the recessed shunt line 30 where Cu is exposed. As the selective cap film 270, the above CuSiN film, Co alloy film, or W film is suitably formed. Thus, by etching the shunt line 30 until the shunt line 30 becomes lower than the bottom of the opening 172, the level difference between the bottom of the opening 172 and the upper surface of the shunt line 30 is made smaller and also the slit portion (X) on the external side of the shunt line 30 at the edge where embedding is difficult to perform can be eliminated. As a result, embedding properties of the barrier metal film 244 can be improved. Further, by forming the selective cap film 270, barrier properties can still be enhanced. Then, by performing a series of processes from the barrier metal film formation process (S140) to the polishing process (S144) with the same content as that in the embodiment 1, a planarized semiconductor device as shown in FIG. 37B can be fabricated.

According to at least one of the above embodiments, semiconductor devices that improve lithographic resolution and optical contrast and also reduce a chip area in a memory device region part can be provided.

Embodiments have been described with reference to specific examples. However, the present invention is not limited to these specific examples.

Though not described above, in addition to Cu, for example, Cu—Sn alloys, Cu—Ti alloys, and Cu—Al alloys can be used as materials of wire and contact plug in each of the above embodiments. Further, the thickness and number of inter-level dielectric films and the size, shape, number and the like of openings can also be used by selecting what is needed for semiconductor integrated circuits and various semiconductor elements when necessary.

In addition, all semiconductor devices and methods for fabricating a semiconductor device that have elements of the present invention and whose design can be modified when necessary by persons skilled in the art are included in the scope of the present invention.

While techniques normally used in the semiconductor industry, for example, a photolithographic process and cleaning before and after treatment are omitted for convenience of description, it is needless to say that such techniques are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
    a plurality of bit lines repeatedly arranged with a same line width and pitch in a memory device region;
    a plurality of shunt lines arranged in a same layer as that of the plurality of bit lines, in parallel therewith, and with the same line width and pitch as those of the plurality of bit lines in the memory device region; and
    an upper-layer contact plug arranged from an upper-layer side so as to be connected to the plurality of shunt lines by extending over two or more shunt lines.

2. The semiconductor device according to claim 1, further comprising:
    a plurality of lower-layer contact plugs for bit lines each arranged so as to be connected to corresponding one of the plurality of bit lines from a lower-layer side by changing an arrangement position alternately regarding a direction in which the plurality of bit lines extends; and
    a plurality of lower-layer contact plugs for shunt lines each arranged so as to be connected to corresponding one of the plurality of shunt lines from the lower-layer side by changing the arrangement position alternately to successively fit to the arrangement position alternately changed from the side of the plurality of lower-layer contact plugs for bit lines.

3. The semiconductor device according to claim 1, further comprising a plurality of lower-layer contact plugs for shunt lines arranged so as to be connected to at least one of the plurality of shunt lines from a lower-layer side.

4. The semiconductor device according to claim 1, further comprising:
    a first dielectric film arranged on a side surface side of each of the plurality of bit lines;
    a second dielectric film arranged on the side surface side of each of the plurality of bit lines and on the first dielectric film and which is a film type different from that of the first dielectric film; and
    a barrier metal film arranged at least in contact with the first dielectric film at the bottom surface of the barrier metal film;
    wherein the upper-layer contact plug is arranged on the barrier metal film.

5. The semiconductor device according to claim 1, wherein a thickness of the plurality of shunt lines positioned below the upper-layer contact plug is formed lower than that of the plurality of bit lines.

6. The semiconductor device according to claim 1, further comprising a plurality of dummy wires formed in a same layer as that of the plurality of bit lines and in parallel therewith in the memory device region, and arranged with the same line width and pitch as those of the plurality of bit lines and between the plurality of bit lines and the plurality of shunt lines.

7. The semiconductor device according to claim 1, further comprising:
    a plurality of lower-layer contact plugs for bit lines each arranged so as to be connected to corresponding one of the plurality of bit lines from a lower-layer side at a same position regarding a direction in which the plurality of bit lines extends; and
    a lower-layer contact plug for shunt lines arranged so as to be connected to one of the plurality of shunt lines from the lower-layer side with the same line width as that of the plurality of lower-layer contact plugs for bit lines and in the same position as that of the plurality of lower-layer contact plugs for bit lines regarding the direction in which the plurality of bit lines extends.

8. The semiconductor device according to claim 7, wherein the lower-layer contact plug for shunt lines is arranged adjacent to one of the plurality of lower-layer contact plugs for bit lines with at least a gap of a region in which a plurality of dummy wires is arranged, the region being between the plurality of bit lines and the plurality of shunt lines.

9. The semiconductor device according to claim 1, further comprising a lower-layer contact plug for shunt lines arranged so as to be connected to the plurality of shunt lines by extending over two or more shunt lines of the plurality of shunt lines from a lower-layer side.

10. The semiconductor device according to claim 9, further comprising:
    a plurality of dummy wires formed in a same layer as that of the plurality of bit lines and in parallel therewith in the memory device region, and arranged with the same line width and pitch as those of the plurality of bit lines and between the plurality of bit lines and the plurality of shunt lines, wherein
    the lower-layer contact plug for shunt lines is arranged so as to be connected to the plurality of shunt lines by extending over the two or more shunt lines and at least one of the plurality of dummy wires.

11. The semiconductor device according to claim 1, further comprising:
    a plurality of lower-layer contact plugs for bit lines each arranged so as to be connected to corresponding one of the plurality of bit lines from a lower-layer side at a same position regarding a direction in which the plurality of bit lines extends; and
    a plurality of lower-layer contact plugs for shunt lines each arranged so as to be connected to corresponding one of the plurality of shunt lines from the lower-layer side with the same line width as that of the plurality of lower-layer contact plugs for bit lines and in the same position as that of the plurality of lower-layer contact plugs for bit lines regarding the direction.

12. The semiconductor device according to claim 11, further comprising:
    a plurality of dummy wires formed in a same layer as that of the plurality of bit lines and in parallel therewith in the memory device region, and arranged with the same line width and pitch as those of the plurality of bit lines and between the plurality of bit lines and the plurality of shunt lines; and
    a plurality of lower-layer contact plugs for dummy wires each arranged so as to be connected to corresponding one of the plurality of dummy wires from the lower-layer side with the same line width as that of the plurality of lower-layer contact plugs for bit lines and in the same position as that of the plurality of lower-layer contact plugs for bit lines regarding the direction.

13. The semiconductor device according to claim 1, further comprising:
    a plurality of dummy wires formed in a same layer as that of the plurality of bit lines and in parallel therewith in the memory device region, and arranged with the same line width and pitch as those of the plurality of bit lines and between the plurality of bit lines and the plurality of shunt lines;
    a plurality of lower-layer contact plugs for bit lines each arranged so as to be connected to corresponding one of the plurality of bit lines from a lower-layer side by changing an arrangement position alternately regarding a direction in which the plurality of bit lines extends;
    a plurality of lower-layer contact plugs for dummy wires each arranged so as to be connected to corresponding one of the plurality of dummy wires from the lower-layer side by changing the arrangement position alternately to successively fit to the arrangement position alternately changed from a side of the plurality of lower-layer contact plugs for bit lines; and
    a plurality of lower-layer contact plugs for shunt lines each arranged so as to be connected to corresponding one of the plurality of shunt lines from the lower-layer side by changing the arrangement position alternately to successively fit to the arrangement position alternately changed from the side of the plurality of lower-layer contact plugs for bit lines.

14. The semiconductor device according to claim 1, further comprising a plurality of lower-layer contact plugs for shunt lines arranged so as to be connected to one of the plurality of shunt lines from a lower-layer side.

15. The semiconductor device according to claim 14, further comprising:
    a plurality of dummy wires formed in a same layer as that of the plurality of bit lines and in parallel therewith in the memory device region, and arranged with the same line width and pitch as those of the plurality of bit lines and between the plurality of bit lines and the plurality of shunt lines;
    a plurality of lower-layer contact plugs for bit lines each arranged so as to be connected to corresponding one of the plurality of bit lines from a lower-layer side at a same position regarding a direction in which the plurality of bit lines extends; and
    a plurality of lower-layer contact plugs for dummy wires each arranged so as to be connected to corresponding one of the plurality of dummy wires from the lower-layer side with the same line width as that of the plurality of lower-layer contact plugs for bit lines and in the same position as that of the plurality of lower-layer contact plugs for bit lines regarding the direction.

16. The semiconductor device according to claim 14, further comprising:
    a dummy wire formed in a same layer as that of the plurality of bit lines and in parallel therewith in the memory device region, and arranged with the same line width and pitch as those of the plurality of bit lines and between the plurality of bit lines and the plurality of shunt lines; and
    a plurality of lower-layer contact plugs for the dummy wire arranged so as to be connected to the dummy wire from the lower-layer side.

17. The semiconductor device according to claim 1, further comprising a lower-layer contact plug for shunt lines arranged so as to be connected to one of the plurality of shunt lines from a lower-layer side at a position overlapping with the upper-layer contact plug.

18. The semiconductor device according to claim 17, further comprising:
    a plurality of dummy wires formed in a same layer as that of the plurality of bit lines and in parallel therewith in the memory device region, and arranged with the same line width and pitch as those of the plurality of bit lines and between the plurality of bit lines and the plurality of shunt lines;
    a plurality of lower-layer contact plugs for bit lines each arranged so as to be connected to corresponding one of the plurality of bit lines from a lower-layer side at a same position regarding a direction in which the plurality of bit lines extends; and a plurality of lower-layer contact plugs for dummy wires each arranged so as to be connected to corresponding one of the plurality of dummy wires from the lower-layer side with the same line width as that of the plurality of lower-layer contact plugs for bit lines and in the same position as that of the plurality of lower-layer contact plugs for bit lines regarding the direction.

19. The semiconductor device according to claim 6, wherein the upper-layer contact plug is arranged so as to be connected to the plurality of shunt lines by extending over the two or more shunt lines and at least one of the plurality of dummy wires.

20. The semiconductor device according to claim 1, further comprising:

a first dielectric film formed on a side surface side of each of the plurality of bit lines and each of the plurality of shunt lines in the memory device region;

a plurality of cap films selectively formed on the plurality of shunt lines; and a second dielectric film formed above the first dielectric film and on a side surface side of the upper-layer contact plug, wherein the upper-layer contact plug is arranged so as to embed a portion thereof in the first dielectric film.

* * * * *